United States Patent
Janos et al.

(10) Patent No.: US 7,821,655 B2
(45) Date of Patent: Oct. 26, 2010

(54) IN-SITU ABSOLUTE MEASUREMENT PROCESS AND APPARATUS FOR FILM THICKNESS, FILM REMOVAL RATE, AND REMOVAL ENDPOINT PREDICTION

(75) Inventors: Alan Janos, Darnestown, MD (US); Montien Saubhayana, Bangkok (TH)

(73) Assignee: Axcelis Technologies, Inc., Beverly, MA (US)

( * ) Notice: Subject to any disclaimer, the term of this patent is extended or adjusted under 35 U.S.C. 154(b) by 419 days.

(21) Appl. No.: 11/053,731

(22) Filed: Feb. 8, 2005

(65) Prior Publication Data

US 2006/0082785 A1    Apr. 20, 2006

Related U.S. Application Data

(60) Provisional application No. 60/542,935, filed on Feb. 9, 2004.

(51) Int. Cl.
*G01B 11/28* (2006.01)
(52) U.S. Cl. .................... 356/630; 156/345.1; 438/1
(58) Field of Classification Search .............. 356/630; 156/345, 345.1–345.55; 438/9, 14, 16, 689; 396/611
See application file for complete search history.

(56) References Cited

U.S. PATENT DOCUMENTS

| | | | |
|---|---|---|---|
| 4,201,579 A | 5/1980 | Robinson et al. | |
| 4,341,592 A | 7/1982 | Shortes et al. | |
| 4,394,237 A | 7/1983 | Donnelly et al. | |
| 4,453,828 A | 6/1984 | Hershel et al. | |
| 4,491,499 A | 1/1985 | Jerde et al. | |
| 4,675,072 A | 6/1987 | Bennett et al. | |
| 4,695,700 A | 9/1987 | Provence et al. | |
| 4,836,902 A | 6/1989 | Kalnitsky et al. | |
| 4,977,330 A | 12/1990 | Batchelder et al. | |
| 4,999,014 A | 3/1991 | Gold et al. | |
| 5,045,704 A | 9/1991 | Coates | |

(Continued)

FOREIGN PATENT DOCUMENTS

JP    2001-284241    *    4/2004

(Continued)

OTHER PUBLICATIONS

John T. Davies, Thomas Metz, "Real-Time In-Situ Measurement of Film Thickness and Uniformity During Plasma Ashing of Photoresist", SPIE, vol. 1392 Advanced Techniques for Integrated Circuit Processing (1990), pp. 551-554.

(Continued)

*Primary Examiner*—Tarifur Chowdhury
*Assistant Examiner*—Tara S Pajoohi
(74) *Attorney, Agent, or Firm*—Cantor Colburn LLP

(57) ABSTRACT

An apparatus and process for in-situ measurement of thin film thickness, ash rate, and end point generally include generating and measuring shallow angle interference patterns. The apparatus generally includes a chamber having a first viewing port and a second viewing port. The first viewing port includes receiving optics configured to receive light at a shallow angle from a surface of a substrate processed therein. The second port includes a broadband illumination source and is preferably disposed in a sidewall opposite the receiving optics. The process includes calculating the thin film thickness, ash rate, and end point from the interference patterns.

12 Claims, 32 Drawing Sheets

U.S. PATENT DOCUMENTS

| | | | |
|---|---|---|---|
| 5,343,412 A | | 8/1994 | Birang |
| 5,362,356 A | | 11/1994 | Schoenborn |
| 5,450,205 A | | 9/1995 | Sawine et al. |
| 5,498,308 A | | 3/1996 | Kamarehi et al. |
| 5,607,602 A | * | 3/1997 | Su et al. ............... 216/76 |
| 5,694,207 A | | 12/1997 | Hung et al. |
| 5,728,253 A | | 3/1998 | Saito et al. |
| 5,739,051 A | | 4/1998 | Saito |
| 5,770,523 A | | 6/1998 | Hung et al. |
| 5,773,201 A | | 6/1998 | Fujimura et al. |
| 5,824,604 A | | 10/1998 | Bar-Gadda |
| 5,846,373 A | * | 12/1998 | Pirkle et al. ............ 156/345.25 |
| 5,877,032 A | | 3/1999 | Guinn et al. |
| 5,877,407 A | | 3/1999 | Cadet et al. |
| 5,882,489 A | | 3/1999 | Bersin et al. |
| 5,908,319 A | | 6/1999 | Xu et al. |
| 5,940,175 A | | 8/1999 | Sun |
| 6,054,333 A | | 4/2000 | Bensaoula |
| 6,074,568 A | | 6/2000 | Adachi et al. |
| 6,113,733 A | * | 9/2000 | Eriguchi et al. ......... 156/345.24 |
| 6,204,922 B1 | * | 3/2001 | Chalmers ............... 356/630 |
| 6,448,094 B2 | * | 9/2002 | Yamazawa et al. ............ 438/9 |
| 6,547,458 B1 | | 4/2003 | Janos et al. |
| 6,585,908 B2 | | 7/2003 | Cardoso et al. |
| 6,863,772 B2 | | 3/2005 | Cheng et al. |
| 2004/0208638 A1 | * | 10/2004 | Jansen ................ 398/183 |

FOREIGN PATENT DOCUMENTS

| | | |
|---|---|---|
| WO | WO 97/37055 | 10/1997 |
| WO | WO 99/26277 | 5/1999 |

OTHER PUBLICATIONS

David Angell and Gottlieb S. Oehrlein, "Grazing Angle Optical Emission Interferometry for End-Point Detection", Appl. Phys. Lett. 58 (3), Jan. 21, 1991, pp. 240-242.

D.L. Flamm, "Dry Plasma Resist Stripping Part I; Overview of Equipment," Solid State Technologies, vol. 35, No. 8, pp. 37-39, Aug. 1992.

D.L. Flamm, "Dry Plasma Resist Stripping Part II; Physical Processes," Solid State Technologies, vol. 35, No. 9, pp. 43-48, Sep. 1992.

S. Dzioba, G. Este, and H. M. Naguib, "Decapsulation and Photresist Stripping in Oxygen Microwave Plasmas," J. Electrochem. Soc.: Solid State Science and Technology, vol. 129, No. 11, pp. 2537-2541, Nov. 1982.

J. Shi, M. Kamrehi, D. Shaner, S. Rounds, S. Fink, and D. Ferris, "Damage Reduction in Dry Resist Stripping Systems," Solid State Technology, vol. 38, No. 10, pp. 75-82, Oct. 1995.

J. J. Hannon and J. M. Cook, "Oxidative Removal of Photoresist by Oxygen/Freon 116 Discharge Products," J. Electrochem. Soc.: Solid State Science and Technology, vol. 131, No. 5, pp. 1164-1169, May 1984.

J. E. Spencer, R. A. Borel, and A. Hoff, "High Rate Photoresist Stripping in an Oxygen After Glow," J. Electrochem. Soc.: Solid State Science and Technology, vol. 133, No. 9, pp. 1922-1925, Sep. 1986.

W. K. Chung, "Reduction of Gate Oxide Degradation in Photoresist Stripping with an RF Downstream Oxygen Plasma," International Conference on Materials and Process Characterization for VLSI (ICMPC'88), Shanghai, China, pp. 414-417, Oct. 24-29, 1988.

Wang and B. Gelernt, "Chemiluminescence During Photoresist Stripping Process", Solid State Technology, vol. 24, No. 11, pp. 121-123, Nov. 1981.

* cited by examiner

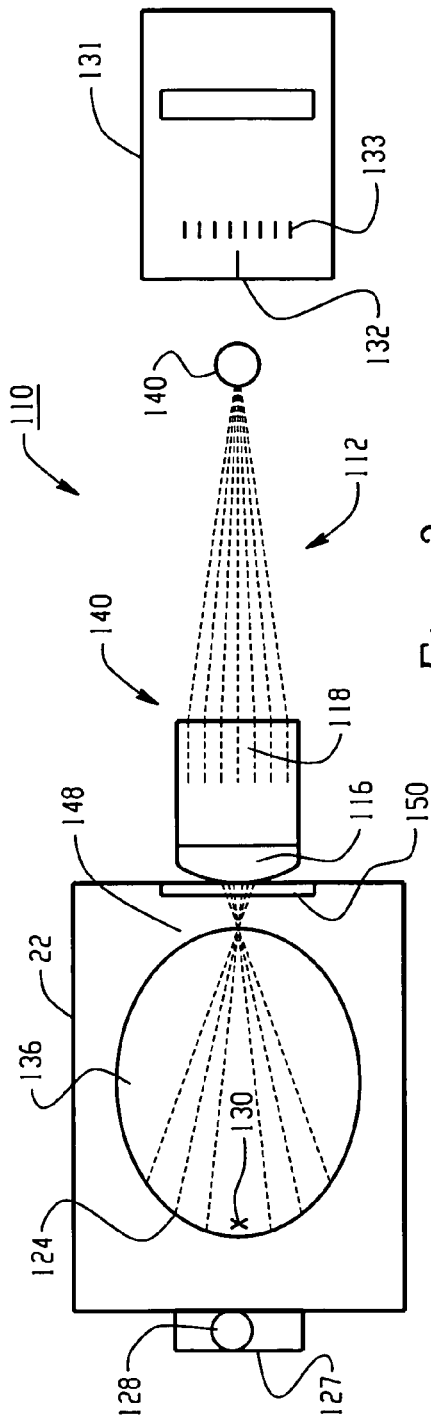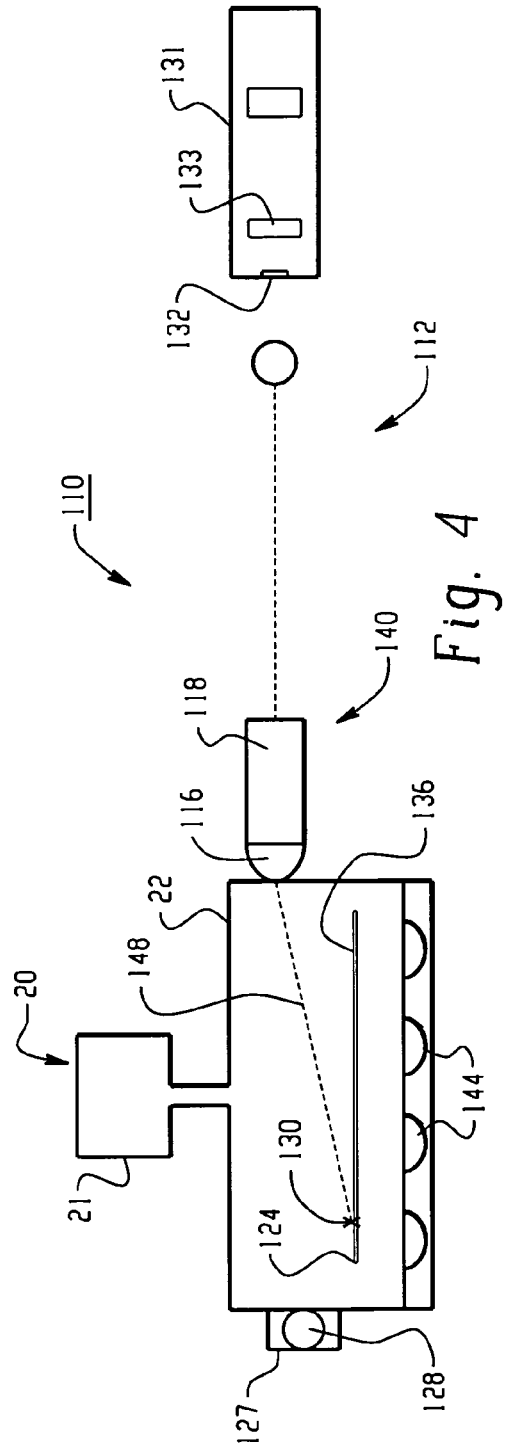

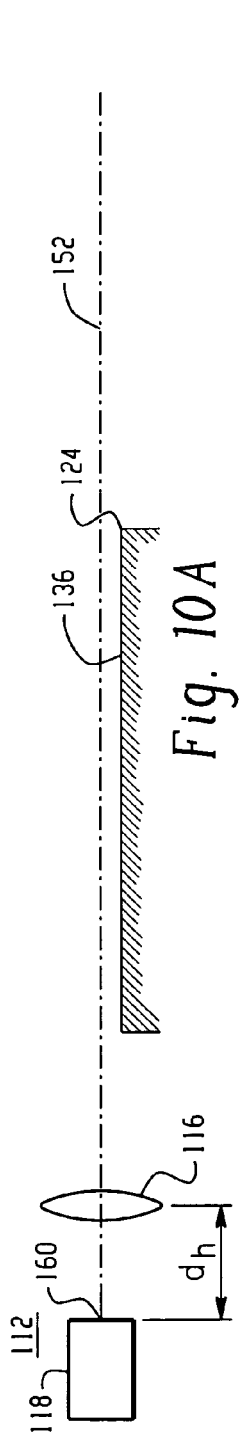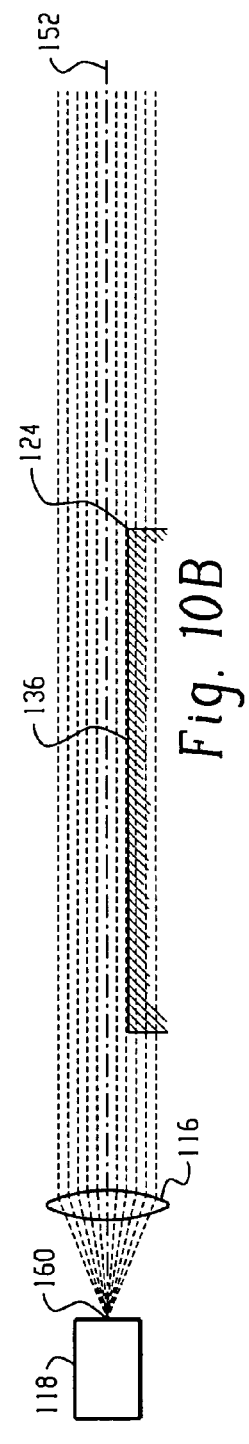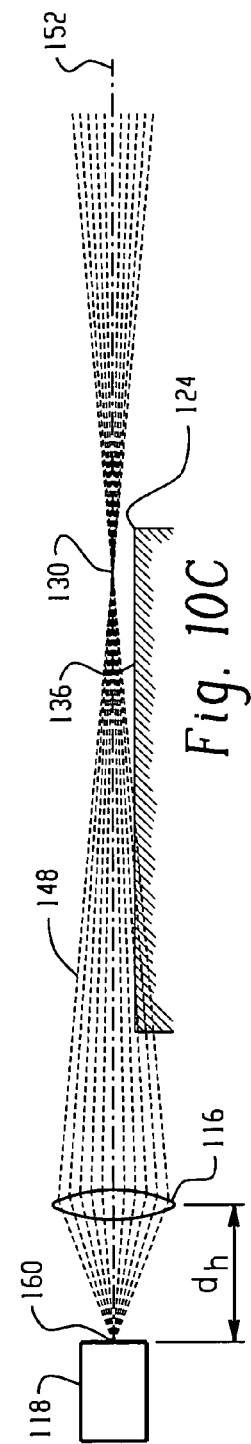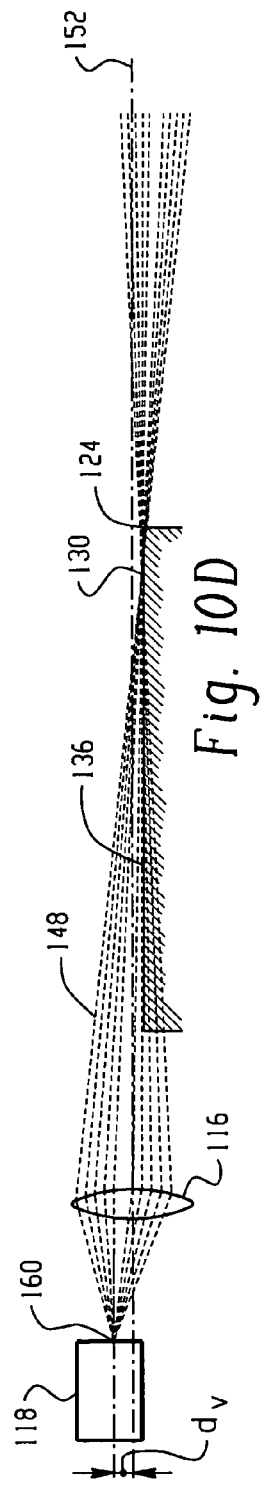

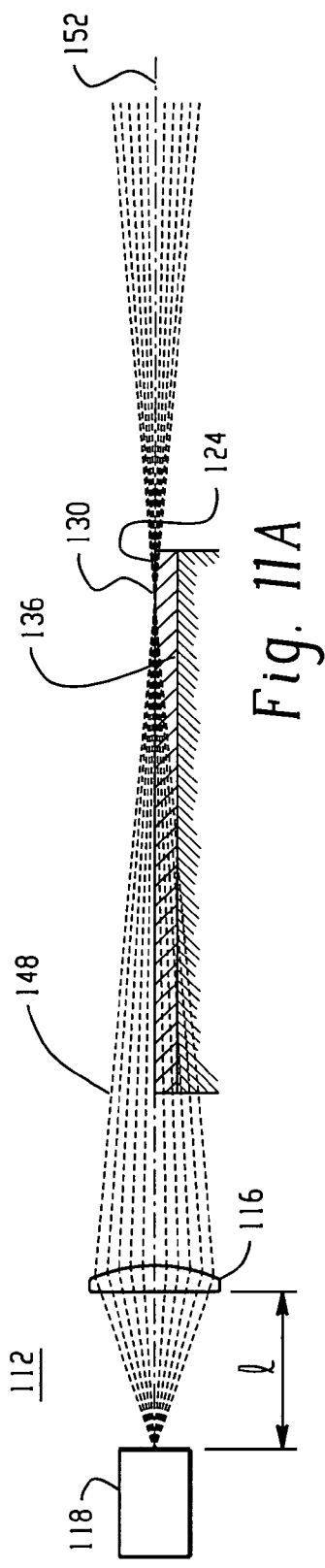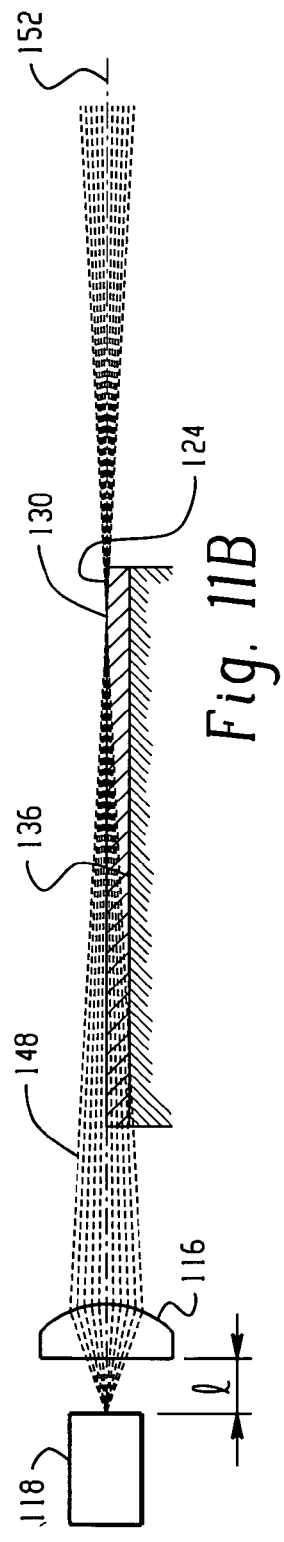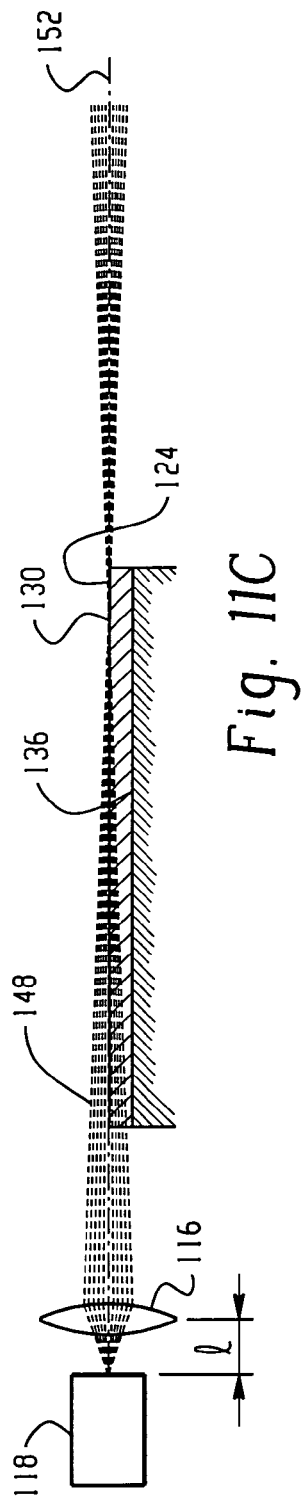

IN-SITU ABSOLUTE MEASUREMENT PROCESS AND APPARATUS FOR FILM THICKNESS, FILM REMOVAL RATE, AND REMOVAL ENDPOINT PREDICTION

CROSS REFERENCE TO RELATED APPLICATIONS

This application claims the benefit of U.S. Provisional Application Ser. No. 60/542,935 filed Feb. 9, 2004.

BACKGROUND

The present disclosure relates to processes and apparatus for in-situ measuring of absolute thickness and removal rate, and processes for predicting process endpoint or combinations thereof.

The fabrication of integrated circuits consists primarily of the deposition and removal of thin films. Various thin films deposited and removed during the course of fabrication include, among others, photoresists, dielectric materials, conductive materials, diffusion barriers, anti-reflection coatings, passivation layers, and the like. Characterizing thickness related measurements such as thickness, removal rate, and endpoint for these thin films is important for numerous well-known reasons. Characterization must often be measured before, during, and after thin film fabrication.

Optical methods are generally employed for measuring various properties of thin films. For example, optical emission spectroscopy (OES) has previously been used to determine the end point of an etching process by providing information about the etching gas and the by-product of the etching gas. The technique relies on the change in the emission intensity of characteristic optical radiation from the dielectric by-product in the plasma. Excited atoms or molecules emit light when electrons relax from a higher energy state to a lower energy state. Atoms and molecules of different chemical compounds emit a series of unique spectral lines. The emission intensity for each chemical compound within the plasma depends on the relative concentration of the chemical compound in the plasma. A typical optical emission spectroscopy apparatus operates by measuring the emission intensities of the reactive etching gas and the by-product of the etching gas and the dielectric. The emission of the by-product decreases and finally stops when an endpoint is reached. The optical emission spectroscopy apparatus senses the declining emission intensity of the by-product to determine this endpoint.

For example, using a barrel type plasma reactor, it has been reported that the light emission intensities at 283 nm from CO* and OH* emission, light emission intensities at 297.7 nm, 483.5 nm, and 519.8 nm from CO*, and light emission intensity at 308.9 nm can be used to determine the amount of photoresist removed, which can be used for determining endpoint by integration of these intensities. In a similar manner, the optical emission signal at 519.6 nm in a parallel plate reactor has been reported as suitable for detecting endpoint. In a downstream plasma reactor, an investigation of abrupt changes in intensities at 309 nm from OH and 431.5 nm from CH* have been used for determining endpoint. However, this technique generally requires an initial thickness measurement from some other method and more importantly, does not produce very accurate endpoint detection.

Other optical systems measure emission intensity at the 431 nm line and combine the data with a statistical method for determining endpoint, but in practice, the results correspond to about 60 to about 70 percent of the actual photoresist removed. To acquire more accurate endpoint detection, the optics have been set to point toward the substrate using optical emission interferometry (OEI) and the 309 nm and 431 nm lines have been used at the same time to determine endpoint. However, this type of system cannot be used for predicting endpoint for the photoresist stripping process in advance.

In downstream plasma reactors with lamp-based heaters for ashing photoresist, the noise from the lamp-based heaters and the speed of the ashing process relative to reactive ion etching (RIE) processes make it difficult to obtain accurate measurements. The radiant wafer heating lamps used to promote the ashing process interferes with the light emitted at the wafer surface. The single wavelength OEI processes simply do not behave well with non-constant light sources in measuring a large dynamic range of thickness.

The geometry of reactor chambers can also prevent the use of OEI, which heavily rely on an incident angle normal to the plane of the substrate. Attempts to use current OEI methods at incident angles other than 0° can result in measurement errors because the light generated at angles can be very low and subject to more noise. In addition, a double frequency component is encountered at high angles of incidence and the low AC/DC ratio associated with the shallow angle further exacerbates signal quality. To deal with this noise, laser light has been employed as the light source, however, alignment issues result as well as localized heating which may give an increased removal rate at the measuring location. Moreover, as previously mentioned, a single wavelength method requires the initial film thickness to be made by some other method since it only provides a rate of thickness change.

Moreover, under the high temperatures that occur during the ashing process, the photoresist can expand and shrink. The expansion and shrinkage of the photoresist layer has never before been reported and is likely to be a source of error for current measurement systems.

It should be noted that the prior art processes fail to accurately provide in-situ thickness, removal rate, and endpoint. There accordingly remains a need in the art for an in-situ non-destructive thickness measurement apparatus and process for determining real-time thickness, ashing rate, and endpoint.

BRIEF SUMMARY

Disclosed herein is an in-situ measurement apparatus and process for measuring absolute photoresist thickness, ashing rate, and predicting process endpoint. In one embodiment, the apparatus comprises a wafer processing chamber including a support for positioning at least one wafer within an interior region of the chamber, wherein the support comprises at least one temperature sensing device in thermal communication with the at least one wafer; a source that routes a wafer treatment material into the processing chamber for removing a coating from an exposed surface of the at least one wafer; receiving optics in optical communication with the chamber, wherein the receiving optics are focused on or about a surface of the coating at a shallow angle; and a broadband illumination source adapted to project broadband radiation into the chamber.

In another embodiment, an apparatus for measuring film thickness, or film removal rate or endpoint or combinations thereof comprises a reaction chamber containing a first port and a second port, wherein the first port is disposed in a sidewall of the reaction chamber and the second port is disposed in a sidewall that opposes the first port; an optical detector coupled to the first port comprising receiving optics focused on a film coating of a substrate disposed in the reaction chamber, wherein the receiving optics is focused at a shallow angle for receiving interference light signals produced by reflected and refracted light beams from the substrate; a broadband light source coupled to the second port for illuminating a surface of the film coating and producing the interference light signals; and computing means in communication with the receiving optics for computing the film thickness, or the film removal rate or the endpoint from the interference signals or combinations thereof.

In another embodiment, a process for measuring film thickness, or film removal rate, or film removal endpoint of a film coating from a substrate or combinations thereof using a known incident angle, film refractive index, and substrate refractive index, the process comprising illuminating a surface of the film coating with a broadband illumination light source; recording interference signals at a shallow angle produced by light reflected and refracted from the film surface by the broadband illumination light source; and calculating the thickness, or the film removal rate, or the endpoint or combinations thereof from the interference signals.

In another embodiment, the process for measuring thickness, or the ashing rate, or the ashing endpoint or combinations thereof of a photoresist during a plasma ashing process comprises illuminating a surface of the photoresist with a broadband illumination light source; recording interference signals at a shallow angle produced by a selected one or a combination of the broadband illumination light source, plasma, and excited species to produce a recorded wavelength domain; subtracting a background spectrum from the recorded wavelength domain and converting the recorded wavelength domain and converting the recorded wavelength domain to a wavenumber domain; performing Fast Fourier Transform and filtering; locating peaks and valleys in a filtered wavelength domain; and calculating the thickness, or the ashing rate, and or the ashing endpoint or combinations thereof from the locations of the peaks and valleys.

Other embodiments of the disclosure are contemplated to provide particular features and structural variants of the basic elements. The specific embodiments referred to as well as possible variations and the various features and advantages of the disclosure will become better understood when considered in connection with the detailed description and drawings that follow.

BRIEF DESCRIPTION OF THE FIGURES

Referring now to the figures, which are exemplary embodiments and wherein the like elements are numbered alike:

FIG. 3 is a schematic plan view depicting an optical system for in-situ measurement of film thickness, removal rate, and endpoint detection;

FIG. 4 is a schematic front elevational view of the optical system of FIG. 3;

FIG. 10A is a schematic of optics having a line of action that extends above a wafer;

FIG. 10B is a schematic of unfocussed optics and a wafer;

FIG. 10C is a schematic of optics focused for a viewing region above the surface of a wafer;

FIG. 10D is a schematic of optics focused at the surface of a wafer;

FIG. 11A is a schematic of optics focused above the surface of a wafer;

FIGS. 11B and 11C are schematics of optics focused above the surface of the wafer with shorter focal lengths than those of FIGS. 11A and 11B, respectively;

DETAILED DESCRIPTION

Disclosed herein is an in-situ measurement apparatus and process for measuring absolute photoresist thickness, ashing rate, and predicting process endpoint. Although the apparatus and processes can be applied to numerous types of films, reference will be made herein to photoresist applications, e.g., a plasma ashing process to remove the photoresist. Other films suitable for use in the measurement apparatus and process will be apparent to those skilled in the art in view of this disclosure, e.g., passivation layers, dielectrics, and the like. The apparatus and processes generally include generating and measuring shallow angle interference patterns of a film. Advantageously, because shallow angle interference patterns are measured, the system and method described herein can be adapted for use with existing plasma equipment such as downstream plasma reactors, barrel reactors, parallel plate reactors, and the like. As such, the system and process can be adapted to use existing viewing ports, optics, and endpoint detection equipment normally found in these types of ashing and etching equipment. The most preferred shallow angles are those angles that can be adapted for use with existing process chambers, which as noted in the background section generally have limited geometric access for optical detection systems.

Figure 1:
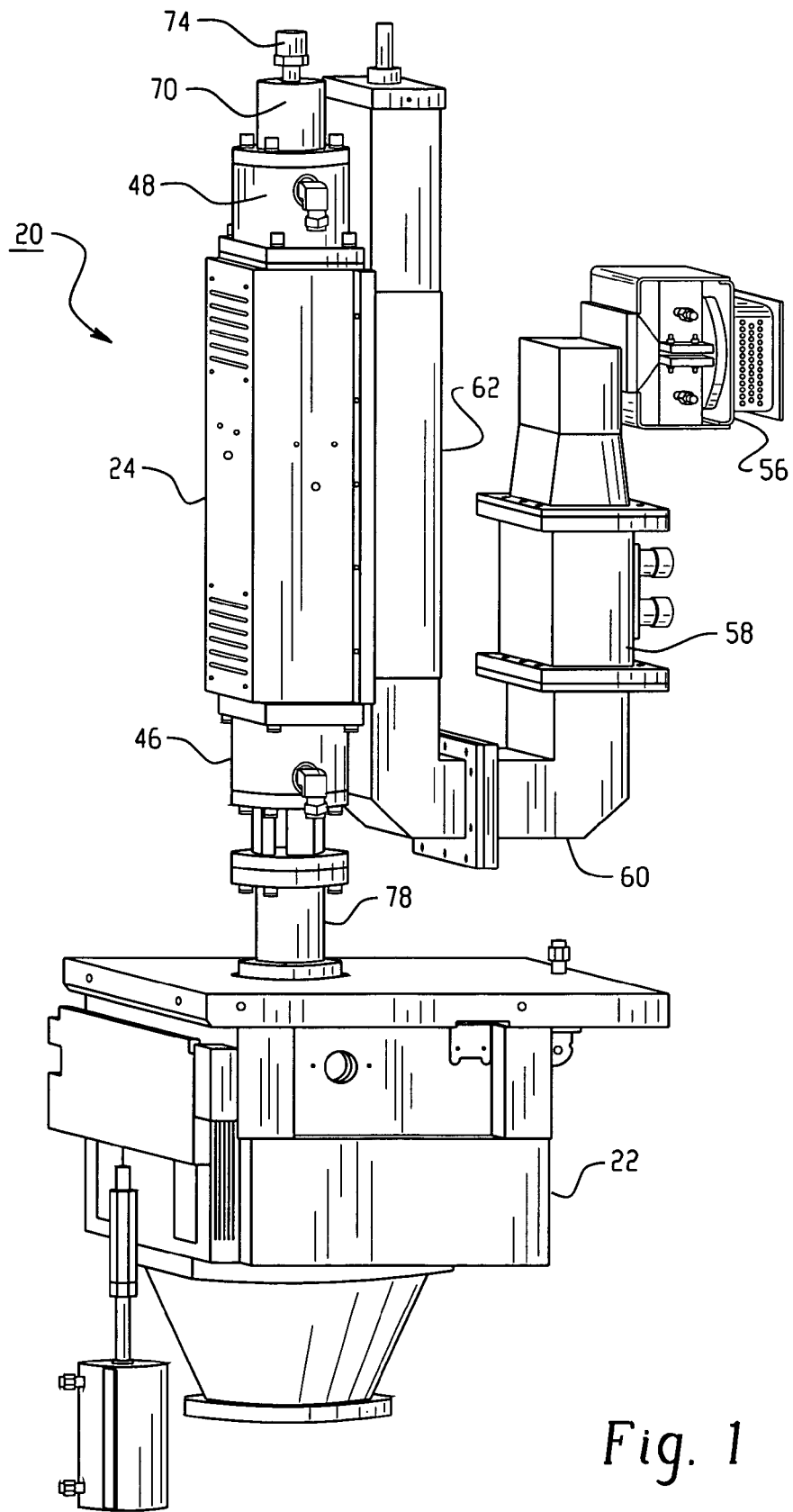
FIG. 1 is a perspective view of a microwave downstream plasma asher.
Figure 2:
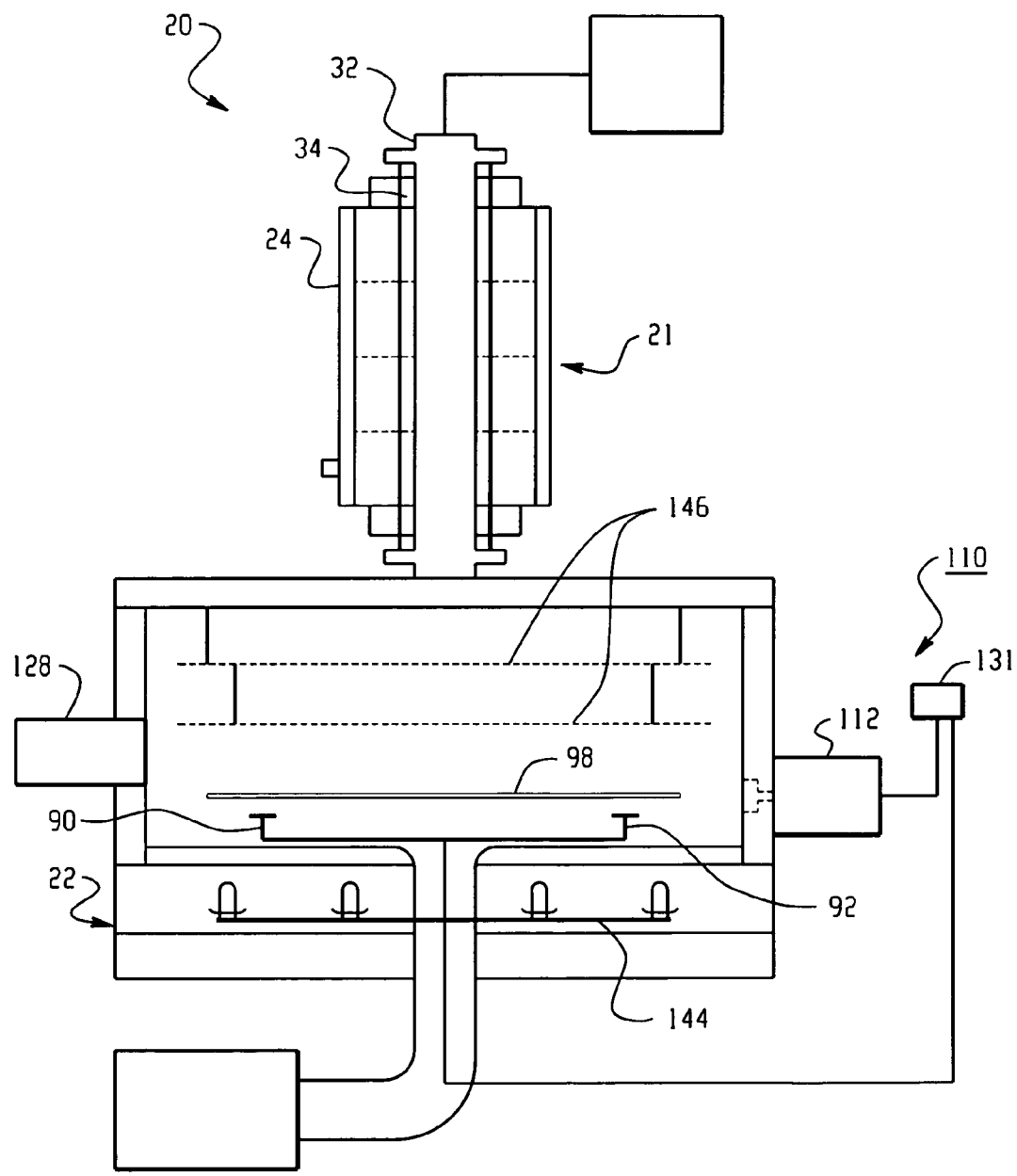
FIG. 2 is a front sectional view of the microwave downstream plasma asher of FIG. 1.
Figure 5:
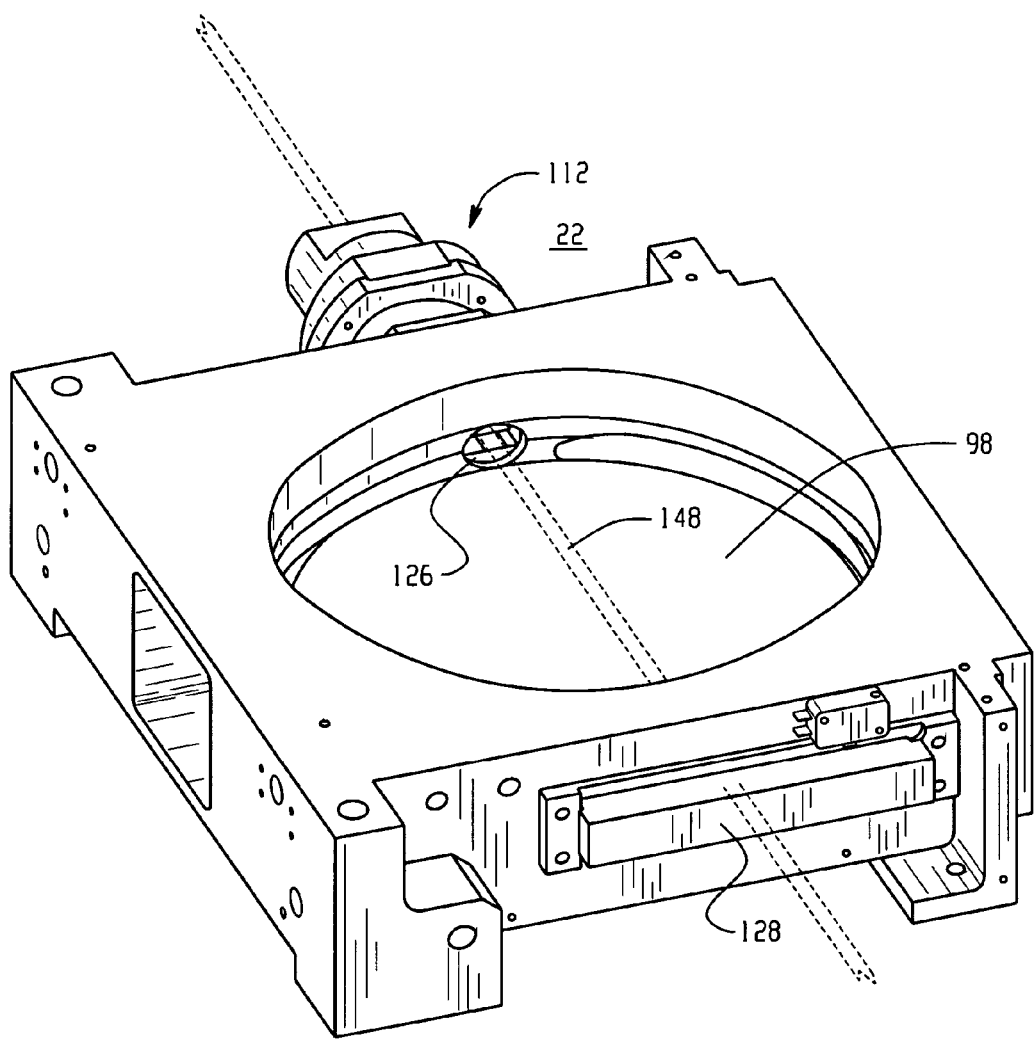
FIG. 5 is a perspective view of the process chamber of the microwave plasma asher.
Figure 6:
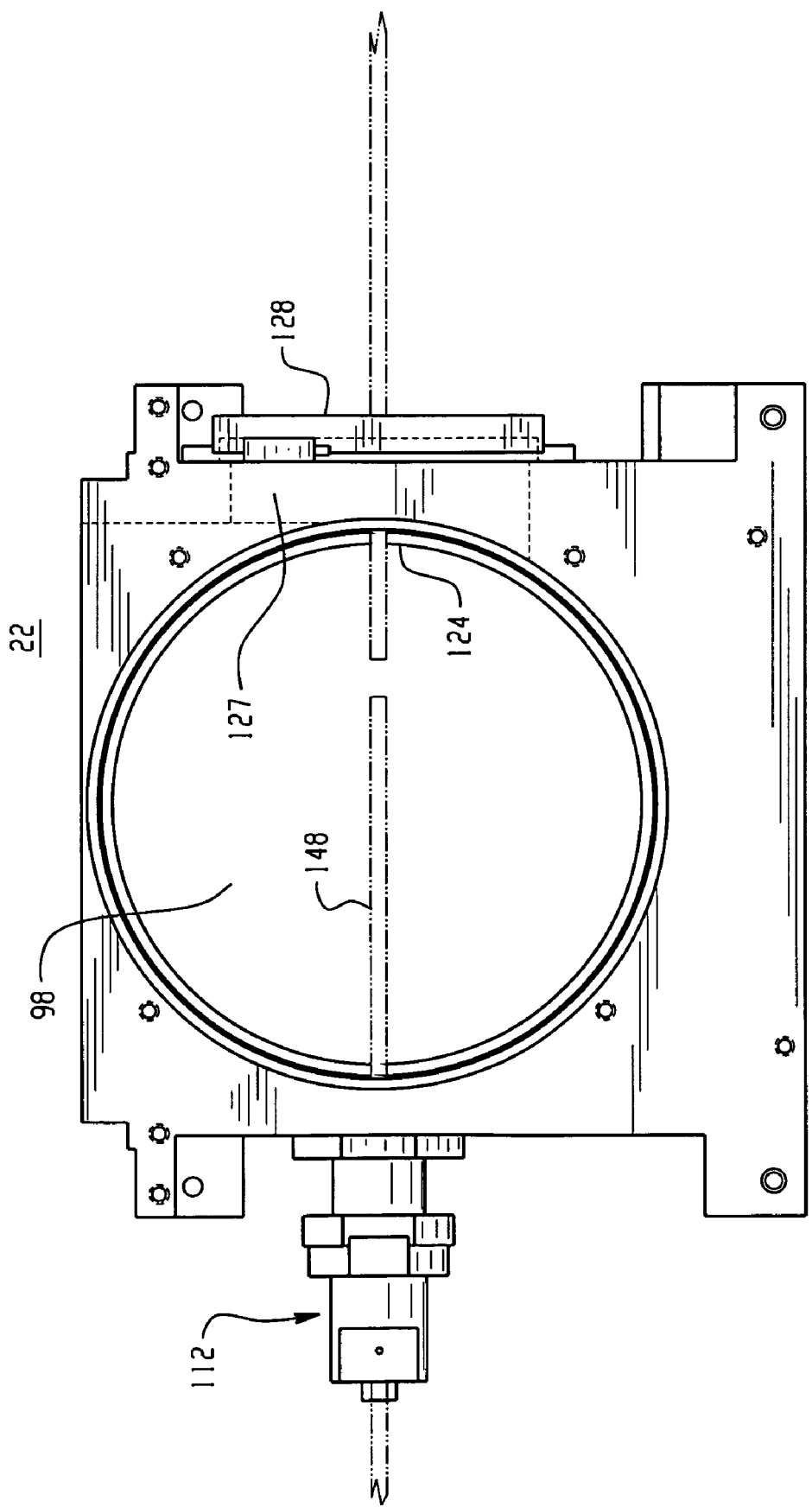
FIG. 6 is a top plan view of the process chamber of the microwave plasma asher.

Referring now to FIGS. 1 and 2, the measurement apparatus is shown configured for use with an exemplary downstream microwave plasma reactor that is generally designated 20. The measurement apparatus generally includes an optical detector having receiving optics focused at a shallow angle relative to a substrate plane and a broadband illumination source. By use of the term shallow angle, it is meant that the interference plane for the receiving optics will be close to 90 degrees with respect to the normal to the wafer. Thus, the focal point of the receiving optics for the apparatus is set at the wafer surface such that light contributing to the interference pattern captured by the receiving optics has a localized origin. This measurement apparatus configuration is especially suitable for in-situ thickness related measurements of photoresist films and/or post etch residue removal.

The illustrated plasma asher 20 includes a plasma-generating chamber 21 and a plasma reaction chamber 22. The plasma-generating chamber 21 includes a microwave enclosure 24. The microwave enclosure 24 is a rectangular box that is partitioned into lengthwise sections having plasma tube 32 passing therethrough. Each partition has an opening through which the plasma tube passes. Each section is fed with microwave energy. Thus, each section appears to be a relatively short cavity to the incoming microwave energy, promoting the formation of modes having azithumal and axial uniformity. Outer tube 34 surrounds the plasma tube 32 inside the cavity. The outer tube 34 is slightly separated from the plasma tube 32 and during operation, air under positive pressure is fed between the two tubes to provide effective cooling of the plasma tube 32. Tube 34 can be made of sapphire. Other plasma tube materials such as quartz or alumina-coated quartz can be used.

An iris plate covers the open side of the microwave structure and is effective to feed microwave energy into the adjacent sections. The plate is a flat metallic plate having irises, through which the microwave energy is fed. Microwave traps 46 and 48 are provided at the ends to prevent microwave transmission. Such traps may be of the type disclosed in U.S. Pat. No. 5,498,308, which is incorporated herein by reference. Air seals/directional feeders are provided for admitting cooling air and feeding it to the space between the concentric tubes.

Magnetron 56 provides microwave power that is fed through coupler 58 to a waveguide supplying TE 10 mode; having mutually perpendicular sections 60 and 62. The length of waveguide section 62 is adjustable with a moveable plunger. At the bottom plate of waveguide section 62 is an iris plate, which couples microwave energy into partitioned microwave enclosure 24, through which the plasma tube 32 extends; thus plasma is excited in the gas flowing through the plasma tube.

Preferably, the microwave enclosure 24 is dimensioned to support the rectangular TM 110 mode and the enclosure 24 may have a square cross section. The dimensions of the cross sections are such that the TM 110 mode is resonant. The length of each section can be less than $\lambda g/2$, where $\lambda g$ is the guide length within the cavity of a TE 104 mode.

Referring again to FIG. 1, an end cap 70 abuts microwave trap 48, and fitting 74 having a central orifice for admitting gas to the plasma tube extends into the end cap. An external flow box (not shown) regulates the gas supply. The plasma tube 32 is supported at this end by "o" ring in the end cap. The outer tube 34 is supported at its ends by abutment against microwave traps 46 and 48. A spacer is present to provide the proper spacing in relation to the process chamber. The other end of the plasma tube is located in end member 78, and has an orifice for emitting gas into the process chamber.

As shown more clearly in FIG. 2, the plasma reaction chamber 22 includes wafer support pins 90 and a thermocouple 92, which support a wafer (i.e., substrate) 98 to be processed. A chuck (not shown) may alternatively be used. Heating may be accomplished by an array of tungsten halogen lamps 144 positioned below wafer 98. Preferably, the wafer is heated from about 80° C. to about 350° C. during ashing. Heating has been found to increase the reaction rate of the plasma with the photoresist and/or post etch residues and consequently, increase throughput. One or more baffle plates 146 may be present above the wafer to promote even distribution of the plasma to the surface.

The reaction chamber 22 also includes the optical detection system, generally designated by reference numeral 110. The optical detection system 110 optically detects a wavelength spectrum produced in the chamber including emission signals corresponding to the reaction by-product between the plasma and the photoresist. The optical detection system 110 as shown generally includes a broadband illumination source 128 and a monitoring system 112. Additional components are coupled to the monitoring system 112 as will be described in greater detail below. The monitoring system 112 is positioned to collect spectra at a shallow angle relative to the plane of the substrate. Likewise, the broadband illumination source 128 is positioned to project broadband illumination into the reaction chamber, and preferably is disposed in a chamber sidewall location opposite the monitoring system 112. The broadband illumination source 128 is preferably a tungsten halogen light source similar to or identical to those used in the heating lamp array 144. Optionally, the broadband radiation can be generated from the plasma itself.

Figure 7:
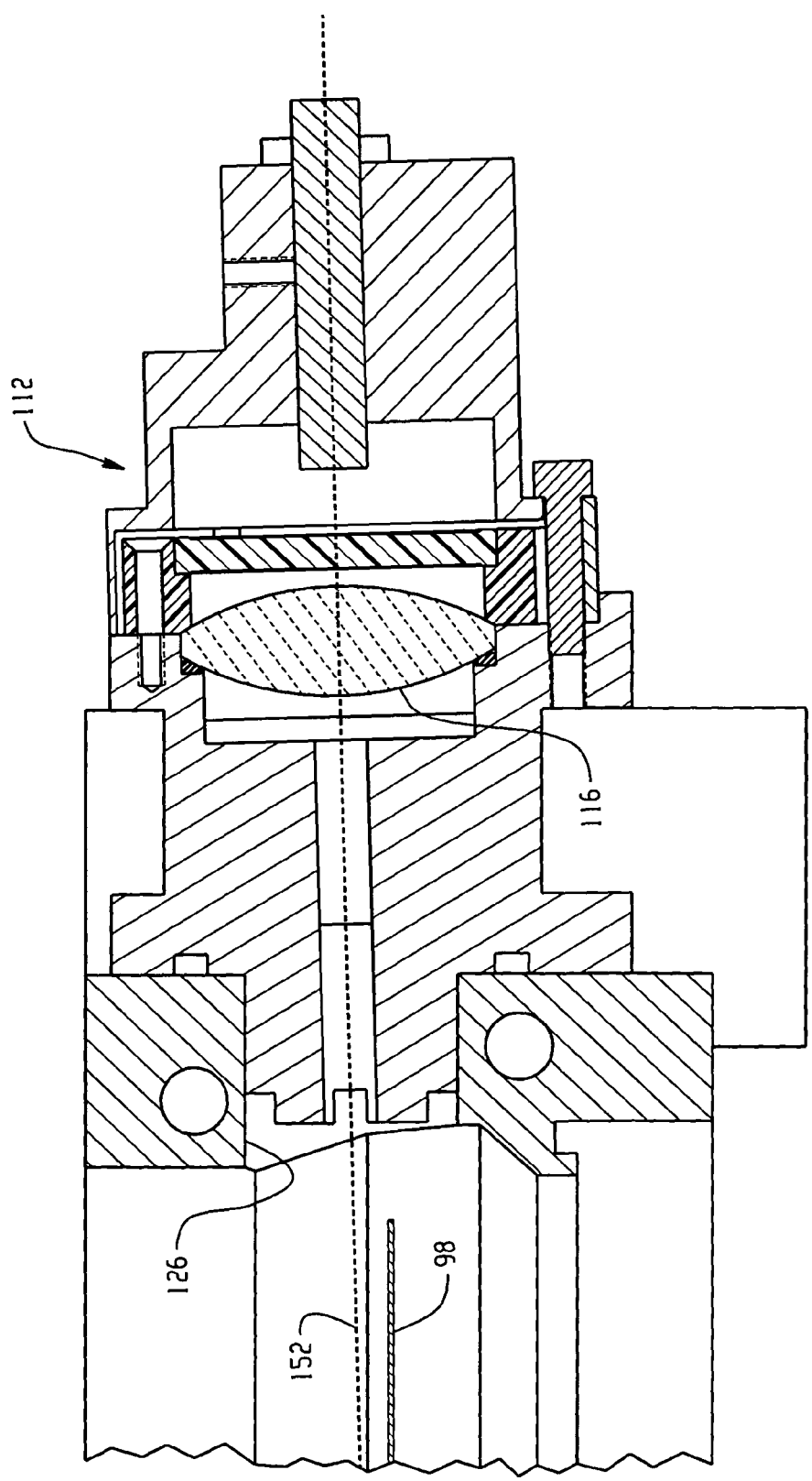
FIG. 7 is an enlarged sectional view of a portion of the process chamber including an optics port attached to the process chamber.
Figure 8:
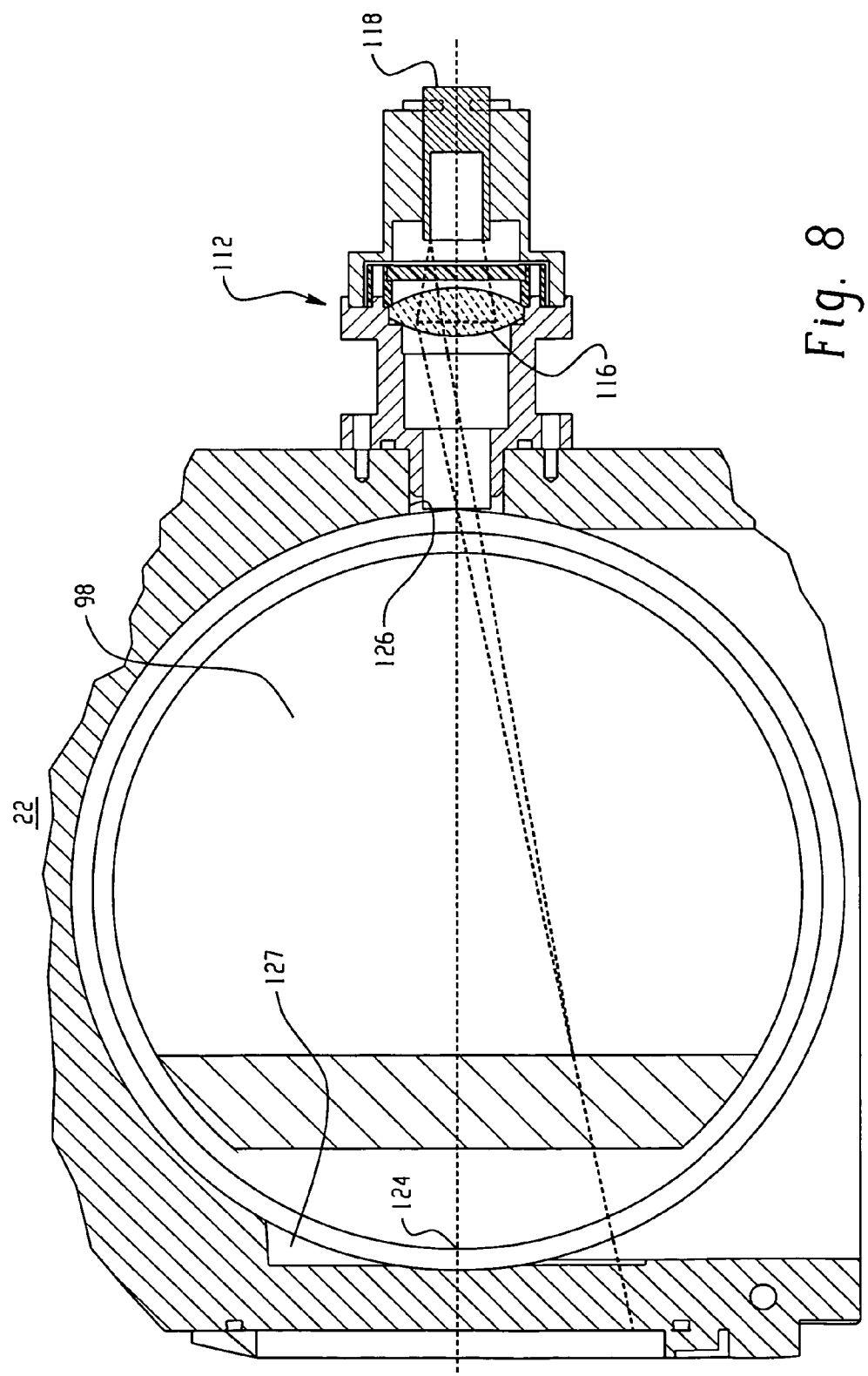
FIG. 8 is a sectional view of a process chamber including the optics port attached to the process chamber.
Figure 9:
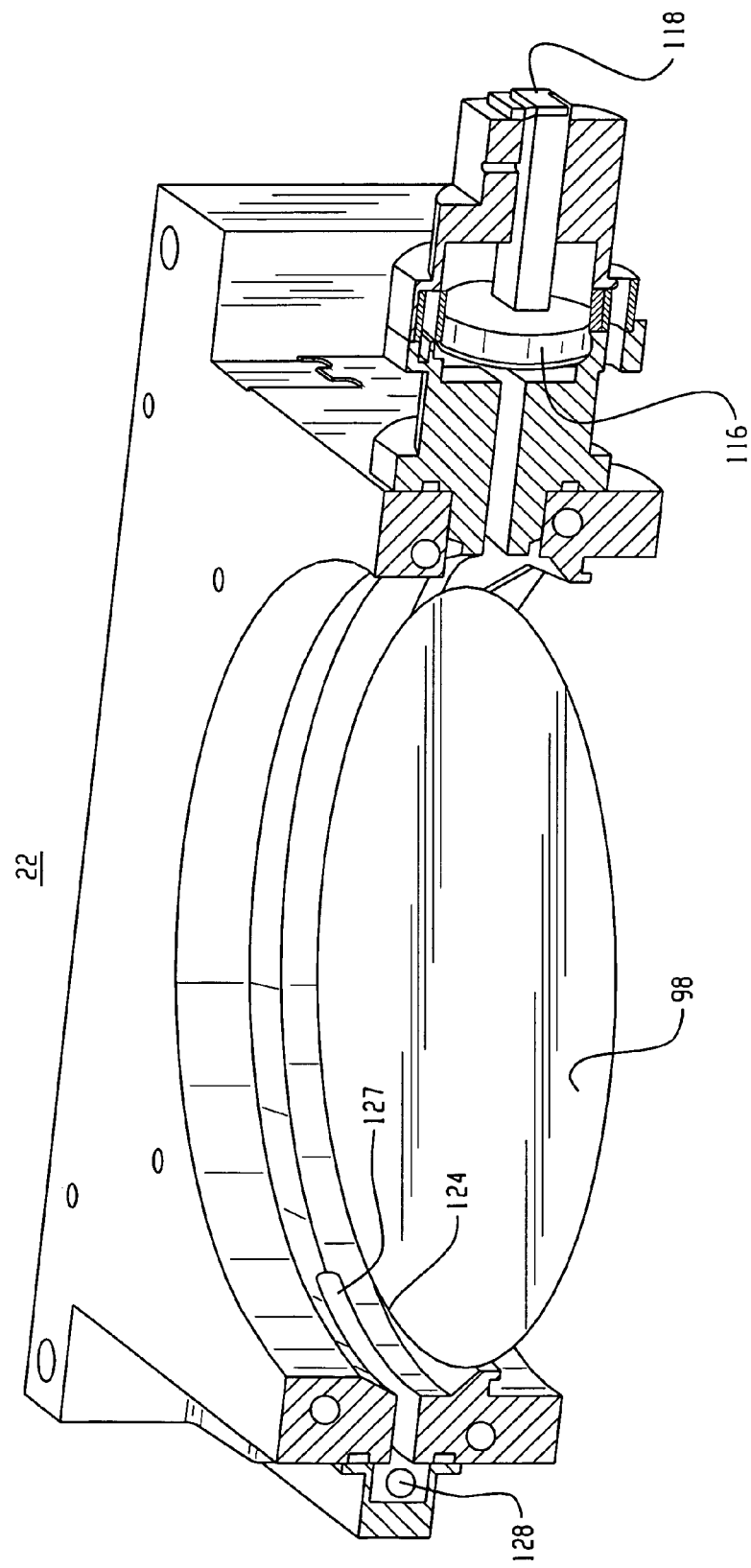
FIG. 9 is a front sectional view of the process chamber having the optics port and a broadband illumination source.
Figure 12:
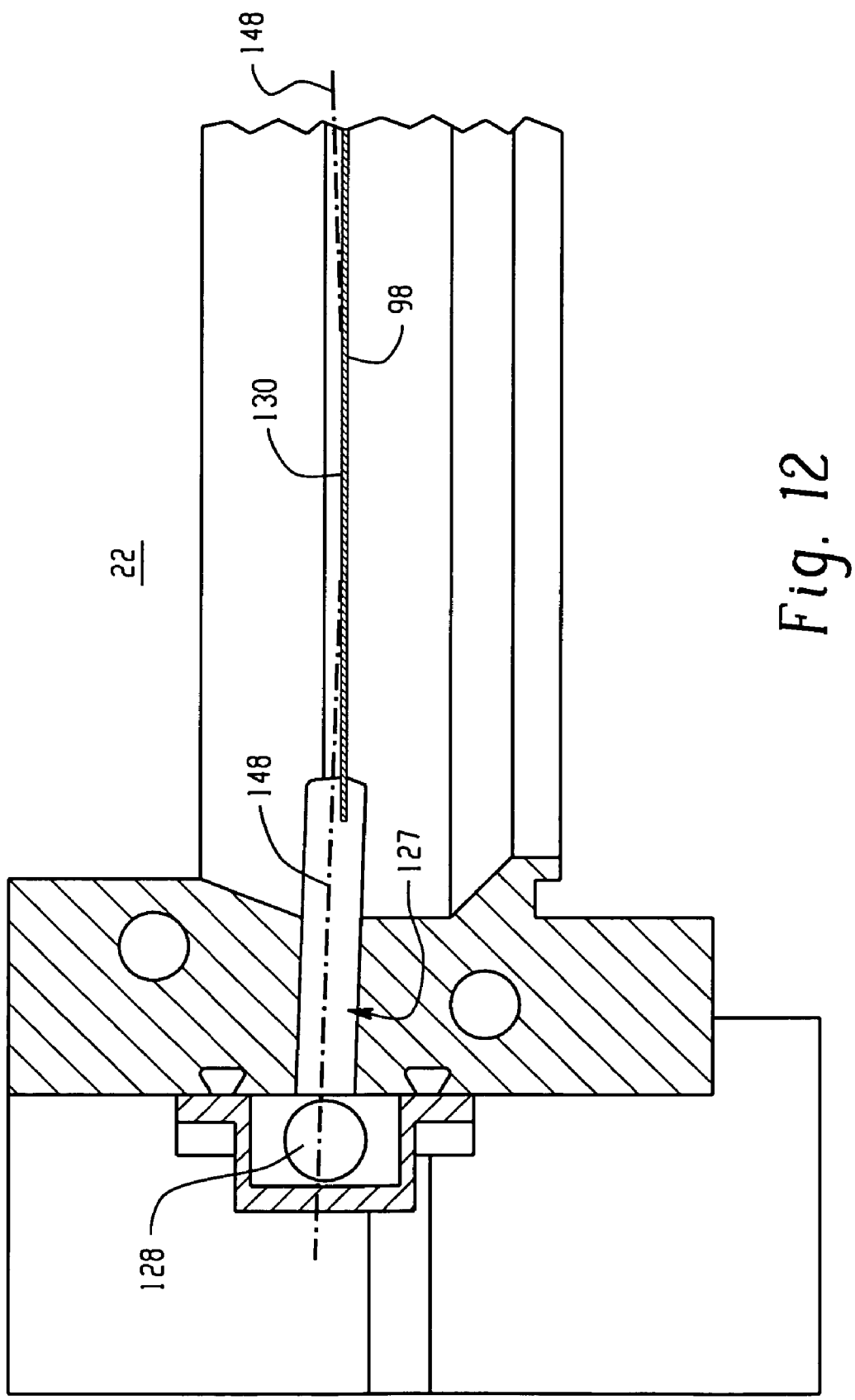
FIG. 12 is an enlarged perspective sectional view of the broadband illumination source.

As shown more clearly in FIGS. 3-8, the monitoring system 112 has receiving optics 140 having a lens 116 focused at a location on or slightly above the surface of the wafer, i.e., at a shallow incident viewing angle. The lens 116 is mounted to the reaction chamber 22 for monitoring concentrations of a reactant by-product of the coating and the wafer treatment material. The lens 116 transmits light from the reaction chamber 22 to fiber optic cables configured so that individual fiber optic fibers are in a linear array 118. A typical array may have 60×0.010-inch-diameter fibers. Ideally, the linear array 118 would be dispersed into a fan shape or arranged to view light originating from regions spaced about the entire surface of the wafer. The lens 116 may be a bi-convex lens positioned outside the chamber or within a recessed port 126 in the chamber as shown in FIG. 7. The radius of curvature of the lens 116 is the same on both sides, and in the exemplary embodiment, the lens is 1.5 inches in diameter and has a 29.8 mm radius of curvature. The lens may be made by CVI Laser Corp. or Esco Products. The optical access port 126 in the process chamber wall should be rectangular shaped, which is wider than it is high. The optical access ports 126 may be adapted to provide a recess for the optics, away from the chamber, the gases, and plasma within, to prevent the optics from becoming dirty or coated with reaction by-products. When the outer surface of the optics 140 becomes dirty, light emitted by the by-product is prevented from entering the optics and unwanted lamp light is diffracted or deflected off the dirt or coating into the optics, resulting in decreased signal to background and signal to noise ratios. The recessed lens or window is less prone to becoming covered with dirt or coating. Furthermore, a narrow port, through which the optics 140 view the process chamber, can optionally be used to reduce the likelihood that coating and other contaminants will cover the outermost optical surface of the optics monitoring system 112. Recessing the outermost surface of the optics 140 substantially reduces the amount of coating, which adheres to the window or lens. Advantageously, the signal to noise and signal to background ratios are increased by recessing the optics 140, because more light is allowed to enter the optics. Additionally, the time between required cleaning of the outer lens or window is reduced substantially by recessing the optics.

The preferred array of fiber optic fibers 118 of the optical detection system is a quartz fiber optic cable coupled to a spectrometer 131 having an input slit 132. Light in the field of view of the optics monitoring system 112 passes through the lens 116 and into the array 118 of fiber optic fibers. The received light travels through the fiber optic fibers to the spectrometer input slit 132. After passing through the input slit 132, the light is separated into its wavelength components by a grating 133 inside the spectrometer 131. The spectrometer includes a charge coupled device (CCD), which categorizes the signals so that the spectrometer can analyze each of the separated wavelength components of the light to determine the characteristics of the light from a line of sight 152 of the optics monitoring system 112 (see FIG. 10 A). In one embodiment, the spectrometer analyzes light from about 200 nanometers (nm) to about 800 nm in about 0.5 nm increments. In an additional embodiment, the integration time of the CCD is 20 milliseconds and the spectrometer averages 5 points in time to give a final result for each wavelength intensity at every 100 milliseconds. The intensities of all wavelengths are time stamped and stored in a computer for future analysis using an appropriate mathematical program such as may be developed with MATLAB® available from MathWorks, Inc., LabVIEW® available from National Instruments Corporation, and like analysis programs. Two suitable spectrometers are model # PC2000 spectrometer available from Ocean Optics, Inc and model #SD1024 spectrometer available from Verity Instruments, Inc.

In the exemplary embodiment, a bi-convex type lens is preferably used to couple and focus the light from the process chamber 22 into the fiber optic fibers 118 or directly into the spectrometer 131. The outermost surface of the optics may be a window 150 in front of the lens 116, or the lens itself, if a protective window is not used. The lens 116 or window 150 behind which the lens sits, is preferably recessed away from the inside of the process chamber 22, as previously discussed.

Optionally, a cylindrical lens can be employed in place of the bi-convex lens to spread the line of sight horizontally across the wafer 98 so that more of the area of concentration above the wafer is sampled. The cylindrical lens may be employed with either a circular bundle of fiber optic fibers or a linear array of fiber optic fibers.

A linear array 118 of fiber optic fibers within a fiber optic cable allows for a more complete sampling of the wafer 98. The present disclosure uses a linear array 118 of fiber optic fibers to view the region of the wafer. For example, a single layer linear array using the 60 fiber optic fibers, nominally 9 to 10 microns in diameter can be utilized, wherein each fiber optic fiber can be made from an original circular bundle of such fiber optic fibers. Other linear arrays may be constructed using N rows and M columns of fiber optic fibers, creating a rectangular type bundle. A circular array of fiber optic fibers may also be used to view a large circular pattern of the substrate. In the case of the round bundle of fiber optic fibers, the viewing optics views not only the wafer 98 and the region above the wafer, but also the lower side of a baffle plate, if present, which may be desirable for some applications.

The use of the linear array 118 of fiber optic fibers provides sampling of a larger area of the wafer and therefore provides increased assurance that there is complete removal of the coating, thereby assuring more reproducible identification of the completion of the etching or ashing process.

In the exemplary embodiment, a fan-shaped distribution of fiber optic fibers may be used in place of the linear array to further enhance the sampling of the wafer. Instead of a parallel configuration of fiber optic fibers, the fiber optic fibers can be spread into a fan-shaped array so that a greater area of the wafer is sampled. If the array is correctly fanned out and has an appropriate number of fiber optic fibers, the entire two-dimensional area of the wafer surface 136 can be sampled. Assurance of complete coating removal is obtained by sampling a majority of the wafer surface 136. Furthermore, with respect to ashing processes, since the wafer 98 often ashes in an axially symmetric fashion, the fan-shaped array of fiber optic fibers will be sensitive to situations in which the outer edge 124 of the wafer 98 ashes last. Conventional methods of optically viewing the reaction chamber 22 are insensitive to situations where the edge of the wafer ashes last. By sampling a larger area of the wafer, an increased assurance of complete removal of the coating is obtained.

In another embodiment, true two-dimensional sampling of the wafer surface may be obtained by configuring the array of fiber optic fibers to sample the wafer discretely. The array 118 of fiber optic fibers can be arranged to focus on and sample discrete locations on the wafer 98, rather than utilizing a line-integral for line-of-sight averaging method. True two-dimensional sampling can be accomplished by determining the exact position required for the receiving end of each fiber optic fiber to sample a uniformly distributed array off points covering the two-dimensional surface of the wafer. A holding block may be employed for maintaining the correct position of each fiber optic fiber. The holding block is machined to accept the fiber optic fibers, with a narrow hole drilled to position each fiber optic fiber corresponding to the fiber optic fiber's appropriate angle and distance from the lens 116. By employing true two-dimensional sampling, the fibers sample a larger representative area of the wafer and therefore provide increased assurance that there is more complete removal of coating, which assures more reproducible identification of the end of the ashing or etching process.

A viewing port 127 on the far side of the reaction chamber 22, opposite the optics monitoring system 112, allows a broadband illumination source 128 to be mounted either recessed in the reaction chamber or outside the process chamber.

Measurement of the signal is optimized by careful selection of the focal point 130 of the optics monitoring system 112. FIGS. 10B to 10D show how an originally unfocussed optics monitoring system 112 can be optimized by properly locating the fiber optic fibers 118 with respect to the lens 116. FIG. 10B depicts an unfocussed optics monitoring system with the viewing ends 160 of the fiber optic fibers 118 located at an unfocussed position. A focal point 130 is defined by adjusting a horizontal distance $d_h$ between lens and the fiber optic fiber ends 160, as shown in FIG. 10C. The distance from the focal point 130 to the lens 116 can be adjusted by changing the horizontal distance $d_h$. Referring to FIG. 10D, the focal point 130 can be positioned closer to the wafer surface 136 by moving the fiber optic fiber ends 160 a vertical distance $d_v$ from the viewing beam axis (line of sight) 152 of the lens 116.

FIGS. 11A-11C show how the focal length L of the selected lens affects the viewing beam 148 of the optics monitoring system 112. By selecting a lens with a short focal length, the viewing beam is narrowed. Using a lens having a short focal length reduces the signal strength, because the viewing beam 148 is narrower. FIG. 11C demonstrates the results of implementation of short focal-length. As shown, the focal point is located in the photoresist film on the substrate.

FIG. 11A shows the original configuration, with the lens 116 and fiber optic fibers 118 on the left and the wafer located at the bottom of the figure. The film-coated wafer is shown slightly below the rays depicting the viewing beam 148. Shorter focal lengths are presented in FIGS. 11B and 11C. A lens with a shorter focal length allows redirection of the rays before they spread much, which maintains a beam-like quality of the viewing beam 148. A narrower viewing beam can be lowered closer to the wafer surface 136 and thereby receive light from regions at the wafer surface 136.

In operation, the semiconductor wafer 98 with photoresist and/or post etch residues thereon is placed into the reaction chamber 22 on wafer support pins 90 and in contact with a temperature sensing device 92, e.g., a thermocouple. The wafer is preferably heated to accelerate the reaction of the photoresist and/or post etch residues with the plasma. The pressure within the reaction chamber is reduced. Preferably the pressure is maintained between about 1 torr to about 5 torr. A wafer treatment gas such as an excitable gas mixture, e.g., an oxygen and forming gas mixture or the like, is fed into plasma tube 32 of the plasma generating chamber 21 via a gas inlet. Each section is fed with microwave energy to excite plasma in the plasma tube 32, which plasma is comprised of electrically neutral and charged particles. The charged particles are selectively removed prior to the plasma entering the reaction chamber. In the case of the oxygen and forming gas mixture, the excited or energetic atoms of oxygen and hydrogen are fed into the reaction chamber and react with the photoresist and/or post etch residue. A reaction by-product evolves and is continuously swept away by a gas sweep within the reaction chamber.

The optical detection system 110 detects light interference patterns on the focused receiving plane over a period of time as the film is removed, i.e., the photoresist layer. The wavelength intensities and interference patterns produced thereby are then used to calculate film thickness, ashing rate, and endpoint detection as will be described in greater detail below. The interference pattern behavior is determined by the differences in refractive index, thickness of the material being removed, wavelength, and angle of incidence. As the thickness of the photoresist changes, so does the interference pattern. The pressure within the chamber is then released up to atmosphere (e.g., air, an inert environment such as $N_2$, and the like) and the processed wafers are removed from the reaction chamber. Once the wafers are withdrawn, a deionized water rinse is then used to remove any remaining residue.

Figure 13:
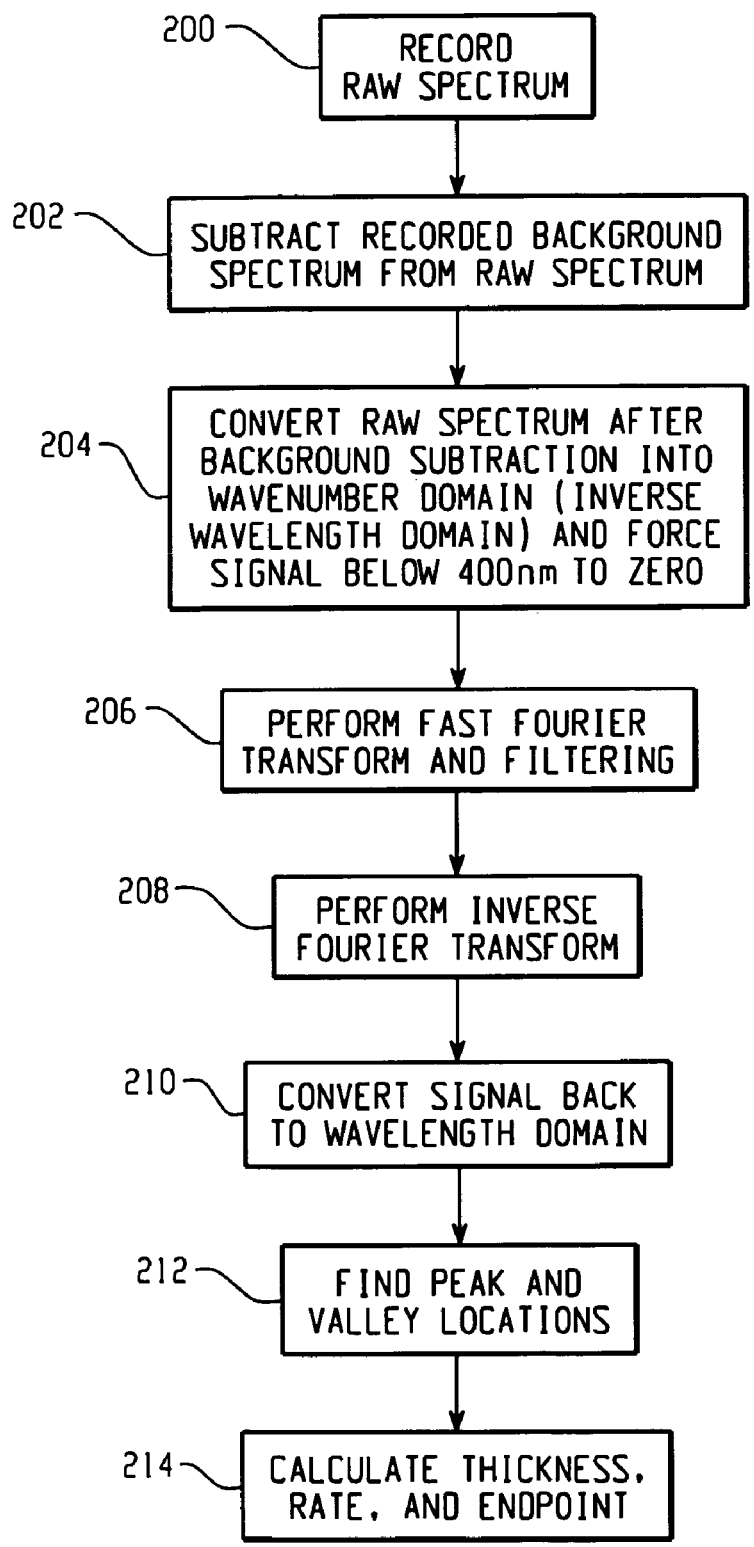
FIG. 13 is a block diagram illustrating the various steps of an algorithm for in situ measurement of thickness, ashing rate and endpoint.

As will be discussed in greater detail as follows, the processes for in-situ measurement generally include the use of an algorithm as is generally shown in the block diagram of FIG. 13. The process flow includes recording the raw spectrum 200 produced within the chamber during processing. In the next step 202, the background spectrum including the spectrum produced by the broadband light source and the heating lamps are then subtracted from the raw spectrum, which is then converted into the wave number domain as shown in Step 204. The signal defining the wave number domain is forced to zero at wavelengths less than 400 nm. Step 206 includes Fast Fourier Transform (FFT) analysis followed by filtering. The filtered Fourier Transform is then subject to an Inverse Fast Fourier Transform in step 208 and then converted back to the wavelength domain as shown in step 210. In step 212, the peaks and valleys of the so-treated wavelength domain are identified and thickness is then calculated in step 214 using either a calculating method or a matching method as will be described.

Figure 14:
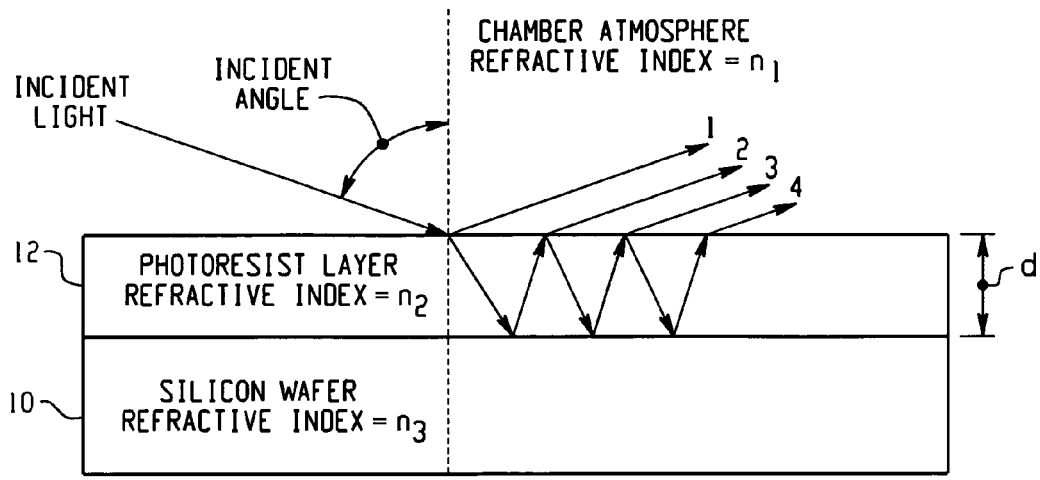
FIG. 14 is a schematic representation of interference from multiple reflections/refractions within a thin transmitting film on a reflective substrate.

Referring now to FIG. 14, there is shown a figure illustrating the general principles of optical interference for thin film coatings on reflective substrate materials, which serves as the theoretical basis for defining the algorithm noted above. A semiconductor wafer 10 having a refractive index $n_3$ is coated with a photoresist layer 12 having a refractive index $n_2$ and is placed into a reactor chamber, wherein the atmosphere of the chamber will have a refractive index $n_1$. The chamber is typically operated at low pressures so that $n_1$ approximates 1, silicon wafers generally have refractive indices of about 3.4 or more, whereas the photoresist used in semiconductor processing generally have refractive indices of about 1.5 to about 2.0. When an external light beam $\lambda$ is projected over the photoresist surface, light is both reflected and refracted from the surface. The reflected light beam (1) and refracted light beams (2, 3, . . . , n, . . . ) travel different distances and reach the receiving plane at different times.

Figure 15:
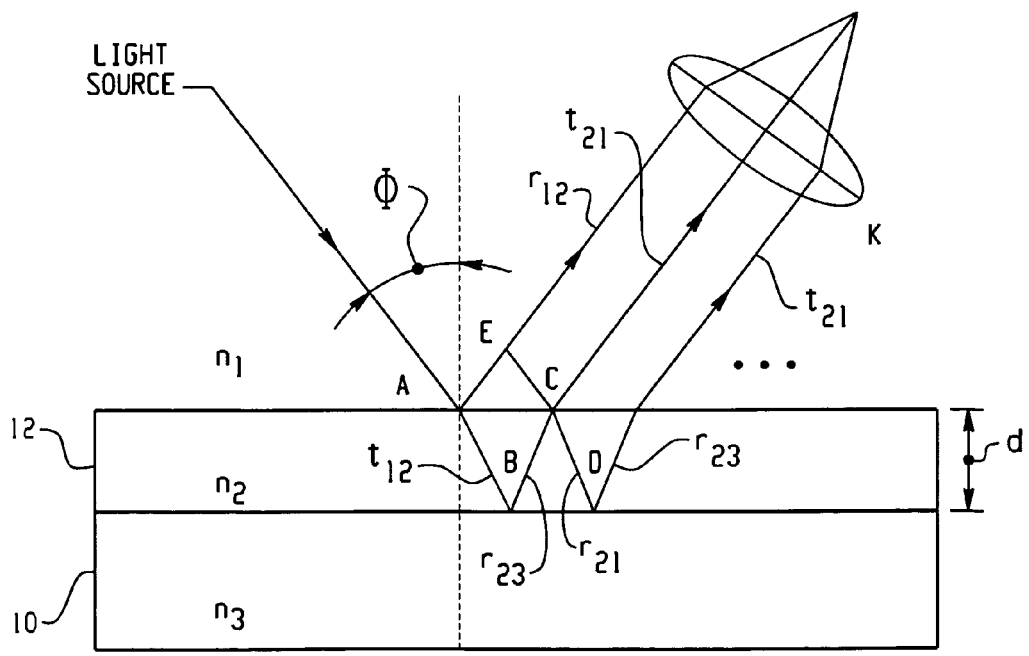
FIG. 15 is a schematic representation of interference from multiple reflections/refractions within a thin transmitting film on a reflective substrate.

Referring now to FIG. 15, an optical path difference between the first and second reflected rays can be described mathematically as shown in Equation (1).

$$\text{optical path difference} = 2d\sqrt{n_2^2 - n_1^2 \sin^2 \phi}, \tag{1}$$

wherein d is the thickness of the photoresist layer, $n_1$ is the refractive index of the chamber atmosphere, $n_2$ is the refractive index of the photoresist layer, and $\phi$ is the incident angle. The optical path differences between other pairs of adjacent reflected rays are also the same as the difference between the first and second reflected rays. Based on the optical path difference, a phase difference at each wavelength ($\lambda$) can be mathematically described as shown in Equation (2).

$$\Delta \psi(\lambda) = \frac{2\pi}{\lambda} 2d \sqrt{n_2^2 - n_1^2 \sin^2 \phi} \tag{2}$$

When this phase difference changes 180 degrees, i.e., $\pi$ radians, the intensity of light coming off of the surface reaches a minimum due to destructive interference, i.e., from highest to lowest signal intensities. Because the phase difference is different at each wavelength, assuming the other parameters are fixed, the spectrum intensities will not be constant over the entire set of reflected wavelengths even if the recorded incident light spectrum has constant intensities, fringes can be observed in the spectrum.

Considering the spectrum of reflected light, if the wavelength moves from one valley to the next valley, the order of interference will change by one and the phase difference will change by $2\pi$. If the refractive indices, incident angle, and wavelengths at two adjacent valleys ($\lambda_1, \lambda_2$) are known, the film thickness can then be calculated in accordance with the following mathematical relationship as shown in Equation (3).

$$d = \frac{1}{2\sqrt{n_2^2 - n_1^2 \sin^2 \phi}} \cdot \frac{\lambda_1 \lambda_2}{(\lambda_1 - \lambda_2)} \tag{3}$$

The incident plane is hereinafter defined as a plane that contains the incident, reflected, and transmitted rays and is perpendicular to the interface plane between two media. Any electric or magnetic field vector that lies in the incident plane is called a p-wave whereas any plane that is perpendicular to the incident plane and also parallel to the interfacing plane is referred to as an s-plane and any vector parallel to the s-plane is referred to as an s-wave. Because light is one kind of electromagnetic wave, Maxwell's equations can be used to describe the behavior of light as it travels in vacuum, in chamber gas, and in a photoresist layer. In the case of electromagnetic waves, it is the electric field vector ($\vec{E}$) that is used to determine whether the light ray is an s-wave or a p-wave. For an interface between two media having different refractive indices, Fresnel's reflection coefficient for the p-wave ($r^p$) and the s-wave ($r^s$) can be mathematically approximated as shown in Equations (4) and (5).

$$r^p \cong \frac{E_r^p}{E_i^p}, \tag{4}$$

and $$r^s \cong \frac{E_r^s}{E_i^s}, \tag{5}$$

wherein $E_r^p$ is the electric field strength of the reflected p-wave in the incident plane; $E_i^p$ is the electric field strength of the incident p-wave in the incident plane; $E_r^s$ is the electric field strength of the reflected s-wave perpendicular to the incident plane; and $E_i^s$ is the electric field strength of the incident s-wave perpendicular to the incident plane.

Fresnel's transmission coefficients can be defined in a similar manner as shown in Equations (6) and (7).

$$t^p \cong \frac{E_t^p}{E_i^p}, \tag{6}$$

and $$t^s \cong \frac{E_t^s}{E_i^s}, \tag{7}$$

wherein $E_t^p$ is the electric field strength of the transmitted p-wave in the incident plane, and $E_t^s$ is the electric filed strength of the transmitted s-wave perpendicular to the incident plane. When light is traveling from medium a to medium b, these Fresnel reflection coefficients can be mathematically related to the refractive indices between two media as shown in Equations (8) and (9).

$$r_{ab}^p = \frac{n_b \cos \phi_a - n_a - \cos \phi_b}{n_b \cos \phi_a + n_a \cos \phi_b}, \tag{8}$$

and $$r_{ab}^s = \frac{n_b \cos \phi_a - n_b \cos \phi_b}{n_a \cos \phi_a + n_b \cos \phi_b}, \tag{9}$$

wherein $n_a$ is the refractive index of medium a in which the incident ray travels, $n_b$ is the refractive index of medium b in which the transmitted ray travels, $\phi_a$ is the incident angle and $\phi_b$ is the transmitted angle.

Similarly, Fresnel's transmission coefficients can be defined as shown in Equations (10) and (11) as light travels from medium a to medium b.

$$t_{ab}^p = \frac{2 n_a \cos \phi_a}{n_b \cos \phi_a + n_a \cos \phi_b}, \tag{10}$$

and $$t_{ab}^s = \frac{2 n_a \cos \phi_a}{n_a \cos \phi_a + n_b \cos \phi_b}. \tag{11}$$

Of interest are the following mathematical relationships between reflection and transmission coefficients as shown in Equations (12) and (13).

$$r_{ba} = -r_{ab}, \quad (12)$$

and $$t_{ba} = \frac{1 - r_{ab}^2}{t_{ab}} \quad (13)$$

Snell's law, which gives the relationship between the incident and transmitted angles, can be described as shown in Equation (14).

$$n_a \sin\phi_a = n_b \sin\phi_b \quad (14)$$

From these equations, it is clear that Fresnel's reflection and transmission coefficients, and Snell's laws are deficient in that only the interface between two media is considered. In contrast, as shown in FIG. 15, there exist three mediums that must be taken into consideration.

In FIG. 15, an infinite number of rays are shown that contribute to the final interference pattern on the receiving plane (e.g., optical detector). The total reflection coefficient (R) can be mathematically defined as shown in Equation (15) as the summation of the infinite numbers of all reflected rays.

$$R = r_{12} + t_{12}r_{23}t_{21}e^{-j2\beta} + t_{12}r_{23}r_{21}r_{23}t_{21}e^{-j4\beta} + \ldots, \quad (15)$$

wherein $r_{ij}$ is the Fresnel's reflection coefficient, $t_{ij}$ is the Fresnel's transmission coefficient, and $\beta$ is the phase angle of the reflected light. It should be noted that $\beta$ is related to the phase difference as previously defined by Equation (2).

$$\beta \cong \frac{\Delta}{2} \quad (16)$$

Alternatively, Equation (15) can be expressed as follows and can be used in both the p-wave and the s-wave with proper application of Fresnel's coefficients. Equation (13) has been used to eliminate the transmission coefficients.

$$R = \frac{r_{12} + r_{23}e^{-j2\beta}}{1 + r_{12}r_{23}e^{-j2\beta}} \quad (17)$$

The total intensity I (with dimension of power) of reflected light can be defined as shown in Equation (18).

$$I = \frac{1}{2}I^p + \frac{1}{2}I^s, \quad (18)$$

wherein $I^p$ is reflected intensity of the p-wave and $I^s$ is reflected intensity of the s-wave. These intensities are related to each of the total reflection coefficients as shown in Equations (19) and (20).

$$I^p = (R^p)^2 \quad (19)$$

$$I^s = (R^s)^2 \quad (20)$$

Figure 16:
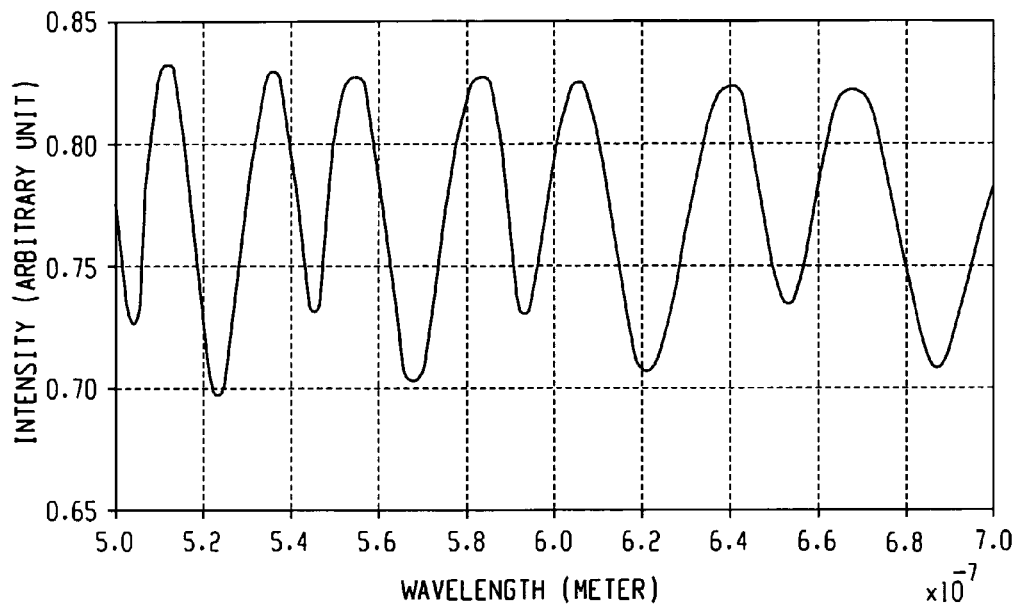
FIG. 16 graphically illustrates a simulated interference pattern of a photoresist at a thickness of 2.4291 microns and at an incident angle of 87.27 degrees.
Figure 17:
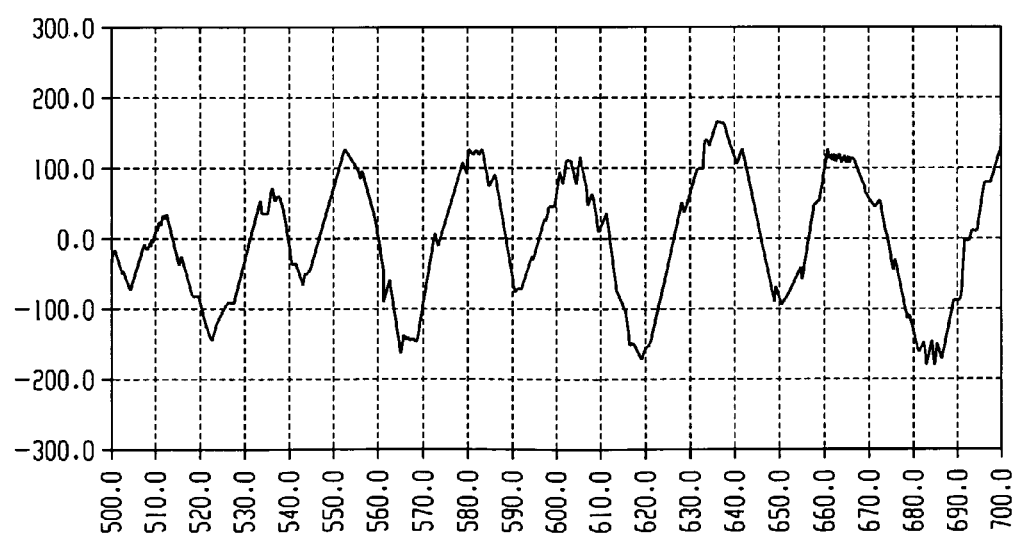
FIG. 17 graphically illustrates a measured interference pattern of a photoresist at a thickness of 2.4291 microns and at an incident angle of 87.27 degrees.

Based on information from Equations (8)-(20) described above, a simulation program was developed with a suitable analytical program such as MATLAB® available from Math-Work, Inc., LabVIEW® available from National Instruments Corporation. Other like analytical programs can be utilized as may be desired. FIGS. 16 and 17 illustrate the simulated and measured interference patterns using MATLAB® for a photoresist film thickness of 2.4291 microns at an incident angle of 87.27 degrees after background subtraction. As shown, the simulation program closely approximates the measured data. Although the measured spectrum data is noisy, a filtering technique can be applied to minimize the noise effects, which will be described in greater detail below.

Figure 18:
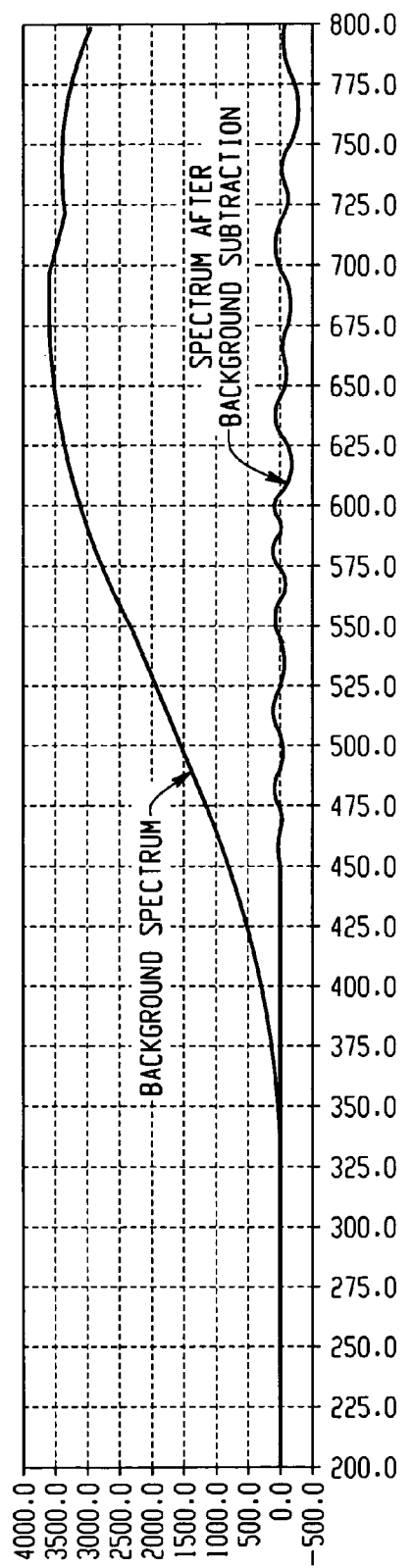
FIG. 18 graphically illustrates reflected light intensity spectrum at 15 seconds compared to the spectrum after background subtraction retaining the interference pattern.
Figure 19:
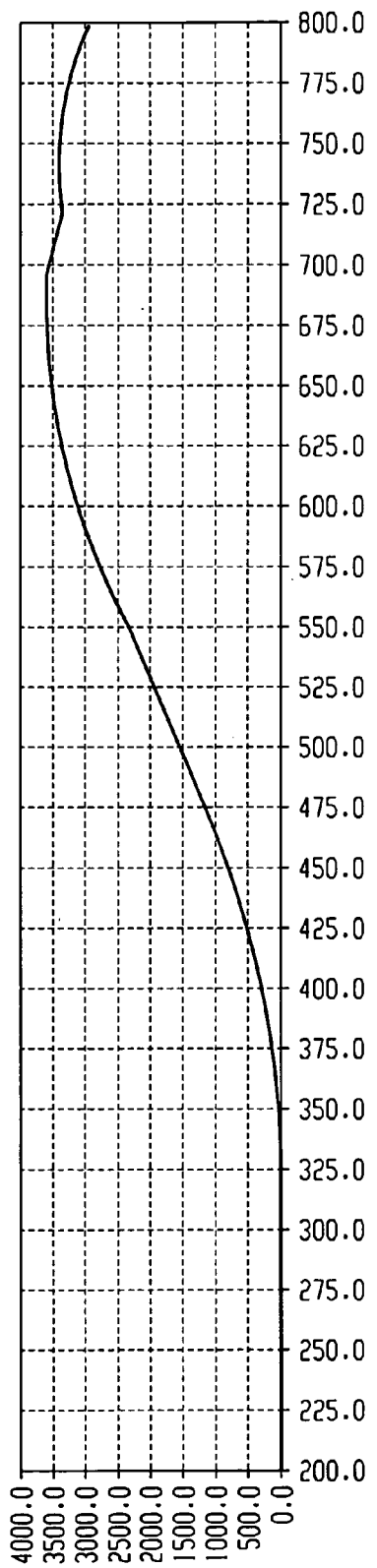
FIG. 19 graphically illustrates a reflected light intensity spectrum from a tungsten halogen lamp source recorded in chamber without any wafer at an incident angle of 87.27 degrees.

Background subtraction is preferably first employed to differentiate and emphasize the interference pattern from the background because the light source produces a non-constant broadband spectrum; the AC/DC ratio is low in the shallow angle measurement; and the interference pattern is imposed on the background broadband signal. Background subtraction removes most of the background light and retains the interference pattern, which is directly related to the film thickness. The subtraction process generally comprises running the desired ashing process using blank wafers, e.g., silicon wafers, which produces a time history spectrum absent the interference patterns. An exemplary spectrum before and after background subtraction is illustrated in FIG. 18. The spectrum after background subtraction clearly shows a ripple pattern representative of the interference. The light source was produced from a tungsten halogen lamp; a spectrum of which is illustrated in FIG. 19. The tungsten halogen light source produces significant intensities at wavelengths of about 450 nm to about 800 nm.

Before the background subtraction, a background subtraction factor is applied to the background spectrum so as to derive the end result close to the zero intensity line, i.e., make the signal below about 400 nm close to zero. The background subtraction factor is obtained by dividing the intensity at each wavelength of the recorded spectrum by the intensity of the same wavelength of the background spectrum for the spectrum between 400 nm and 800 nm. The average of these quotients can then be used to derive the background subtraction factor, which is then multiplied against the background spectrum. The background spectrum is preferably the spectrum produced during actual process conditions and at different times for a dummy "uncoated" wafer disposed in the chamber, e.g., a substrate upon which the film will be removed. By applying the background subtraction factor, the spectral intensities below 400 nm will be forced to zero since the intensity at these wavelengths using a tungsten halogen lamp source are relatively low compared to those intensities at wavelengths greater than 400 nm (see FIG. 21).

Figure 20:
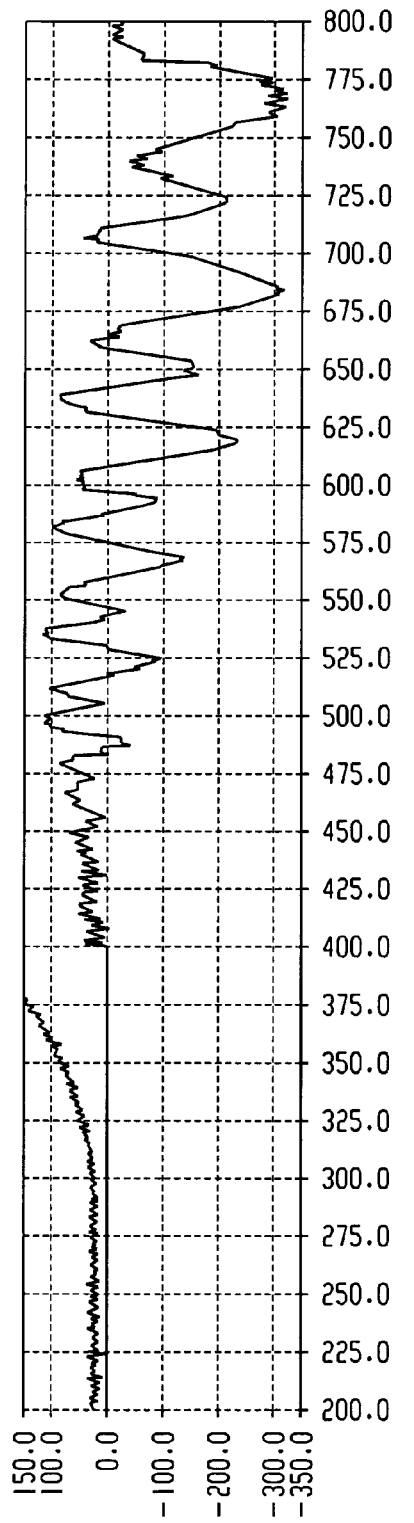
FIG. 20 graphically illustrates a reflected light intensity spectrum as defined in FIG. 18 at 15 seconds after background subtraction.
Figure 21:
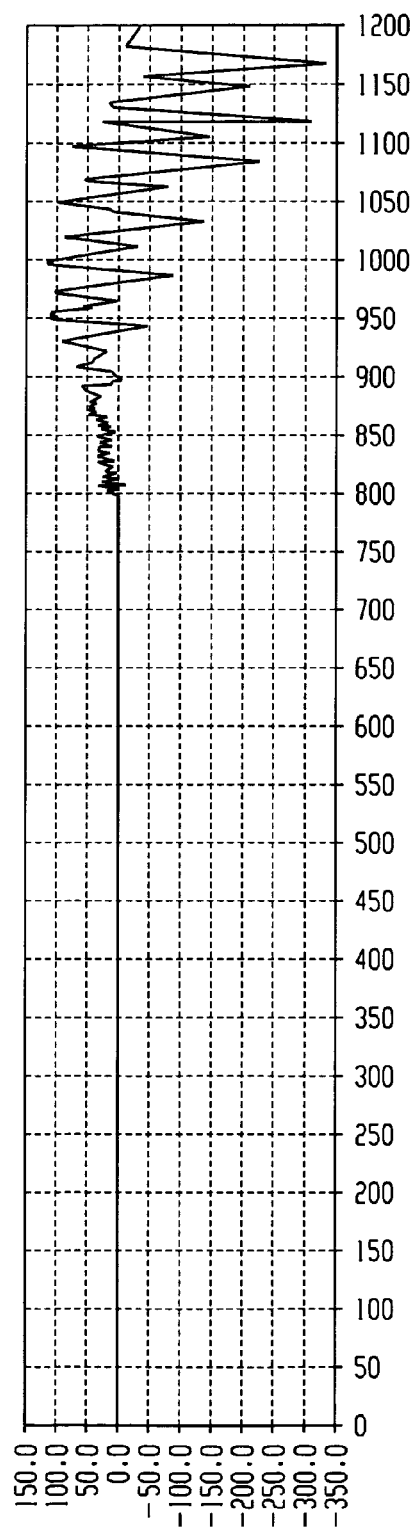
FIG. 21 graphically illustrates a reflected light intensity spectrum as defined in FIG. 18 at 15 seconds after background subtraction and after conversion to the wave number (inverse wavelength) domain.
Figure 22:
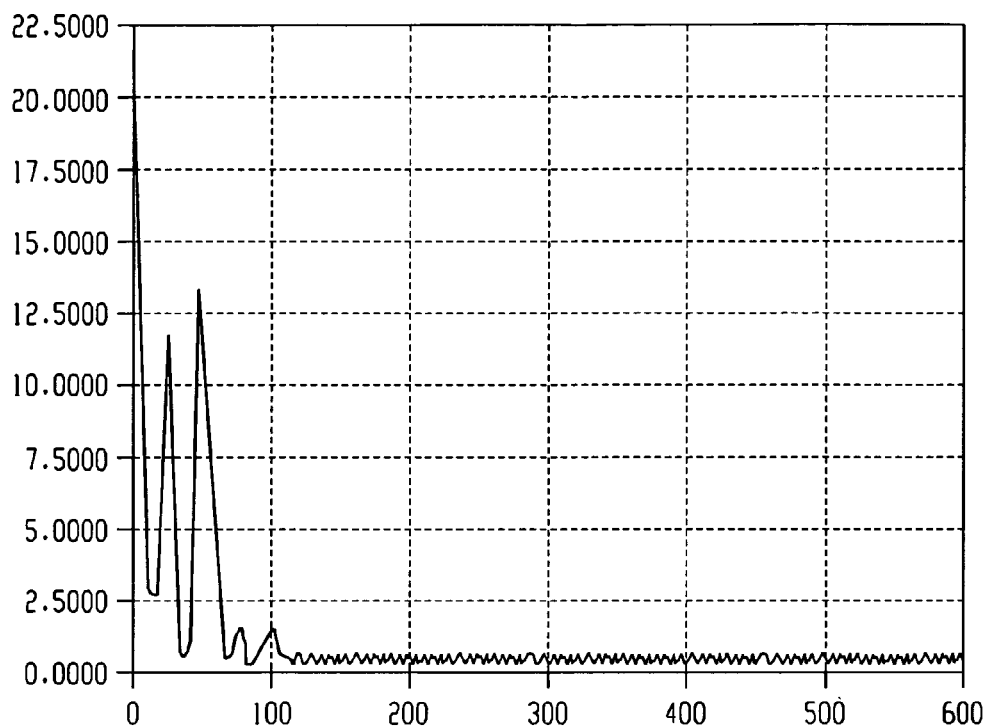
FIG. 22 graphically illustrates the Fast Fourier Transform of the signal as defined in FIG. 21.

Once the background subtraction factor has been applied, the resulting wavelength domain is converted to an inverse wavelength domain. As calculated using equations (16)-(20), the periodicity of the light intensity is inversely proportional to the wavelength indicating that plotting the intensities as a function of inverse wavelength would result in a uniform periodicity. FIGS. 20 and 21 graphically illustrate such a conversion. From these figures, it is observed that the intensities did not change. More importantly, the variations in the spectrum in the inverse wavelength domain have a more uniform periodicity than the spectrum in the wavelength domain. Interpolation, if necessary, is then performed so as to make the data samples equally spaced so as to prepare the data for standard Fast Fourier Transform (FFT). FIG. 22 illustrates the FFT signal in the inverse wavelength domain, which, preferably, is then filtered. After detecting the two peaks of the fundamental and double frequency components, the remaining high frequency contents to the immediate right of the first valley above the double frequency component are filtered. If the incident angle is significantly greater than the Brewster's angle, then the second maximum peak is located.

The second peak should be located at about one half or double the frequency of the maximum peak. If the incident angle is significantly smaller than the Brewster's angle, the minimum valley is located on the right side of the higher (in frequency content space) maximum peak. All frequency content between the minimum valley and DC content are kept whereas all frequency content outside these two contents are set as being equal to zero.

For a given material, the Brewster's angle $\theta_B$ can be mathematically defined as in Equation (21).

$$\theta_B = \tan^{-1}(n_2/n_1), \tag{21}$$

wherein $\theta_B$ is the incident angle relative to the normal to the surface, $n_1$ is the refractive index of the material from which the light is incident, essentially the vacuum of the process chamber, $n_2$ is the refractive index of the material onto which the light is incident, e.g., silicon or other wafer material. At the Brewster's angle, all light of polarization of the electric field that is in the plane of incidence is transmitted into the second material with no reflected component. The plane of incidence is defined as the plane that contains both the incident and reflected or refracted rays of light.

Figure 23:
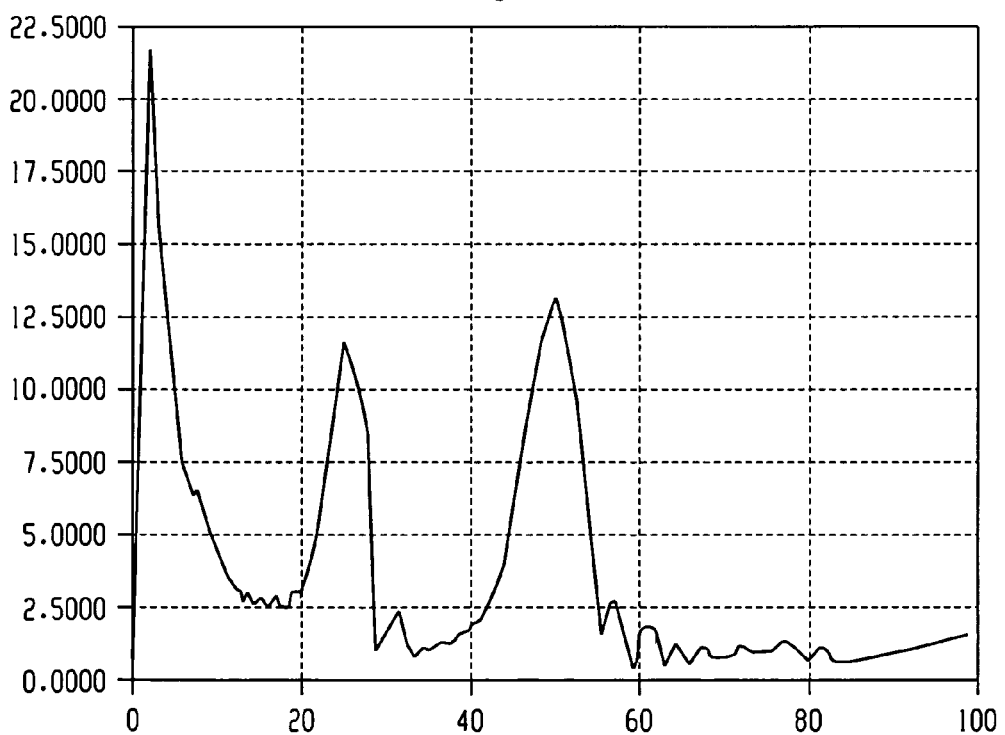
FIG. 23 graphically illustrates the Fast Fourier Transform of the signal as defined in FIG. 21 before filtering.
Figure 24:
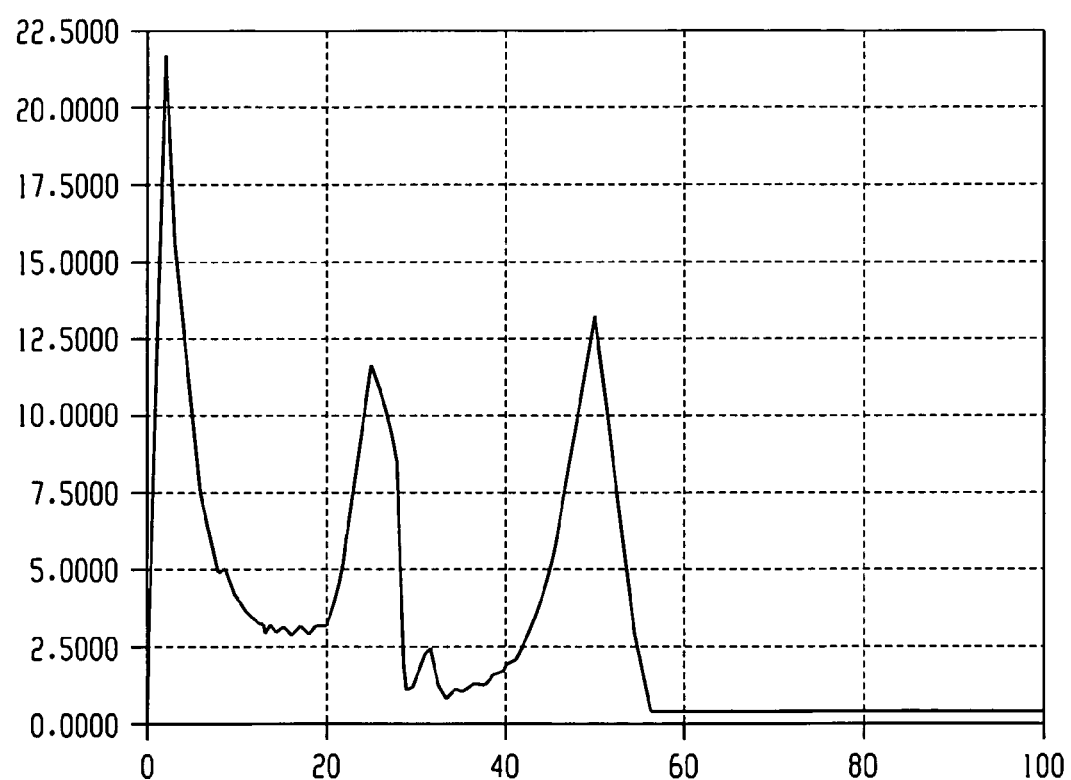
FIG. 24 graphically illustrates the Fast Fourier Transform of the signal as defined in FIG. 21 after filtering FIG. 25 graphically illustrates the wavelength domain as defined in FIG. 21 after performing Inverse Fast Fourier Transform, conversion back to the wavelength domain, and interpolation to make the sampling equally spaced.

FIGS. 23 and 24 graphically illustrate the FFT signal in the inverse wavelength domain before and after filtering. As shown in FIG. 23, the main frequency component is at a frequency content of about 25 and the double frequency component is at a frequency content of about 50. The first valley on the right of the double frequency component is at a frequency content of about 55. As shown in FIG. 24, the filtered FFT signal defines the amplitude of the frequency content at greater than 56 to be zero.

Figure 25:
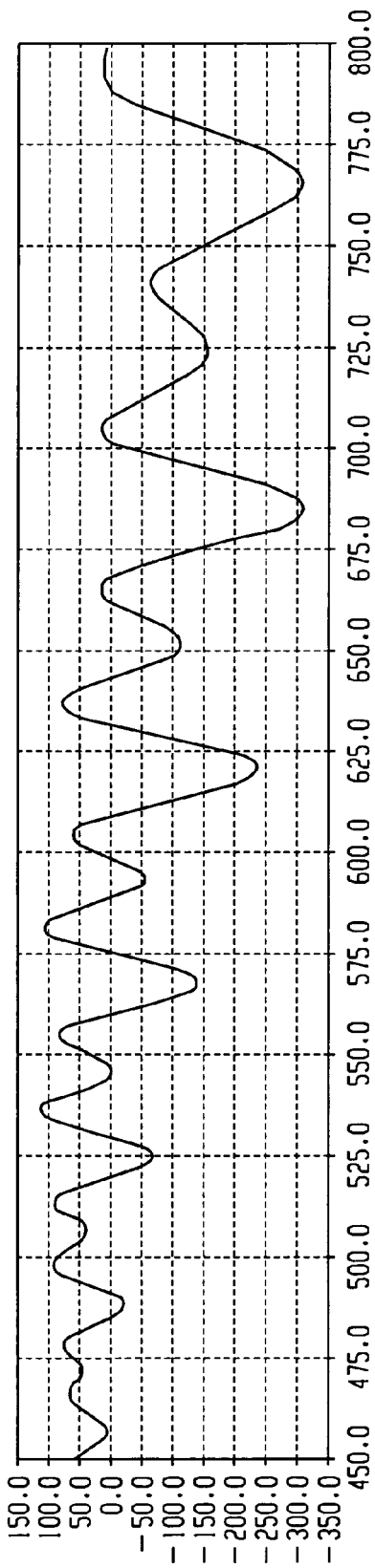
Figure 26:
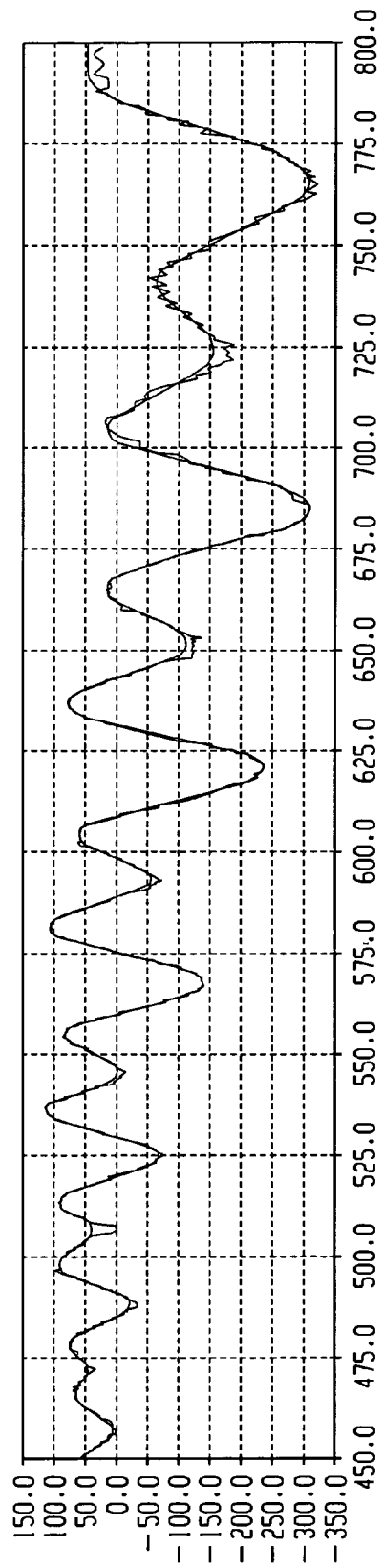
FIG. 26 graphically illustrates the spectrum as defined in FIG. 18 before and after filtering.

Once filtering is complete, Inverse Fast Fourier Transform (IFFT) is performed, which converts the data back to the wavelength domain. Optionally, the filtered spectrum is interpolated to make the samples equally spaced. FIG. 25 illustrates the spectrum after filtering and conversion back to the wavelength domain. FIG. 26 graphically illustrates an overlay of the filtered and unfiltered data. As expected, filtering significantly reduces noise from the original signal.

For in-situ film thickness calculation, a matching or calculating technique using the locations of the peaks and valleys is used. For example, the peaks and valleys for the data presented in FIG. 25 can be summarized as shown in Table 1, which represents thickness measurement data of AZP4210 photoresist from Clariant Corporation on a silicon substrate.

TABLE 1

| Valley Locations (nm) | 471.0 | 487.5 | 505.5 | 524.5 | 546.0 | 568.0 |
|---|---|---|---|---|---|---|
| | 594.0 | 620.5 | 652.0 | 685.0 | 724.5 | |
| Peak Locations (nm) | 477.5 | 497.5 | 513.5 | 536.0 | 555.0 | 581.5 |
| | 605.0 | 637.0 | 665.5 | 705.5 | 741.0 | |

A computer simulation program based on Equations (14), and (16)-(20) was employed for using the matching technique and compared to off-line measurements. The simulation program included inputs for incident angle, wavelength range of interest, refractive indices of photoresist and substrate, and a targeted thickness range. The simulation program used Cauchy Coefficients for AZP4210 photoresist on silicon wafers and an incident angle of 87.27 degrees. The Cauchy coefficients for the AZP4210 photoresist were determined to be as follows: A=1.59; B=1.3395×10$^{-6}$; C=-4.687×10$^{12}$, where $n(\lambda) = A + B/\lambda^2 + C/\lambda^4$. The Cauchy coefficients for the real part of silicon refractive index were determined to be as follows: A=3.8860; B=-1.9930×10$^7$; and C=7.2610×10$^{14}$. The Cauchy coefficients for the silicon extinction coefficient were determined to be as follows: A=0.1369; B=-9.168×10$^6$; and C=1.75×10$^{14}$. The thickness range was set to 3.00 microns to 0.5 microns with 0.001-micron steps. The wavelength resolution was set to 0.5 nanometers. Offline thickness measurements were made using a PROMETRIX apparatus.

Figure 27:
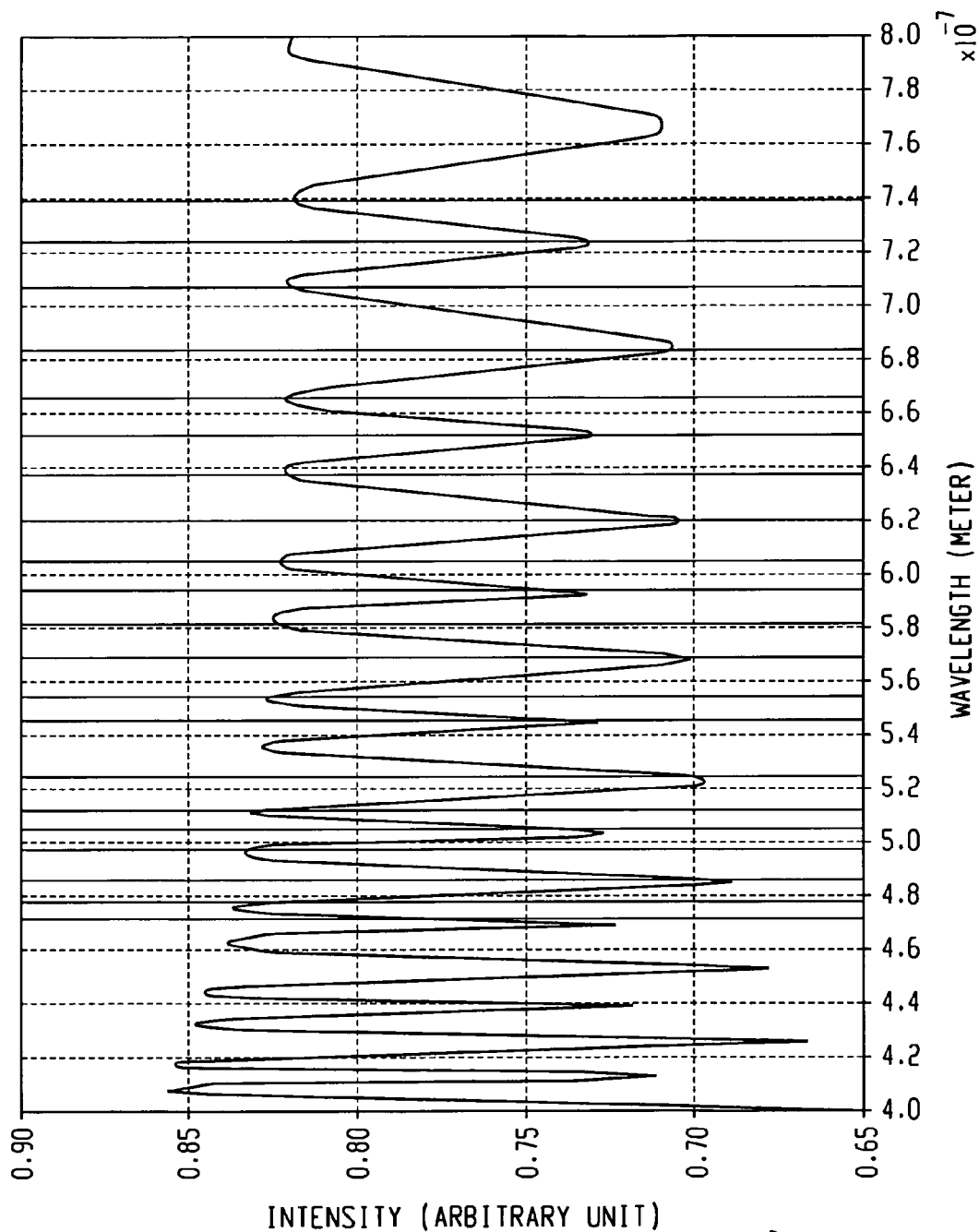
FIG. 27 graphically illustrates a simulated interference pattern from a matching method, wherein the vertical lines represent locations of peaks and valleys.
Figure 28:
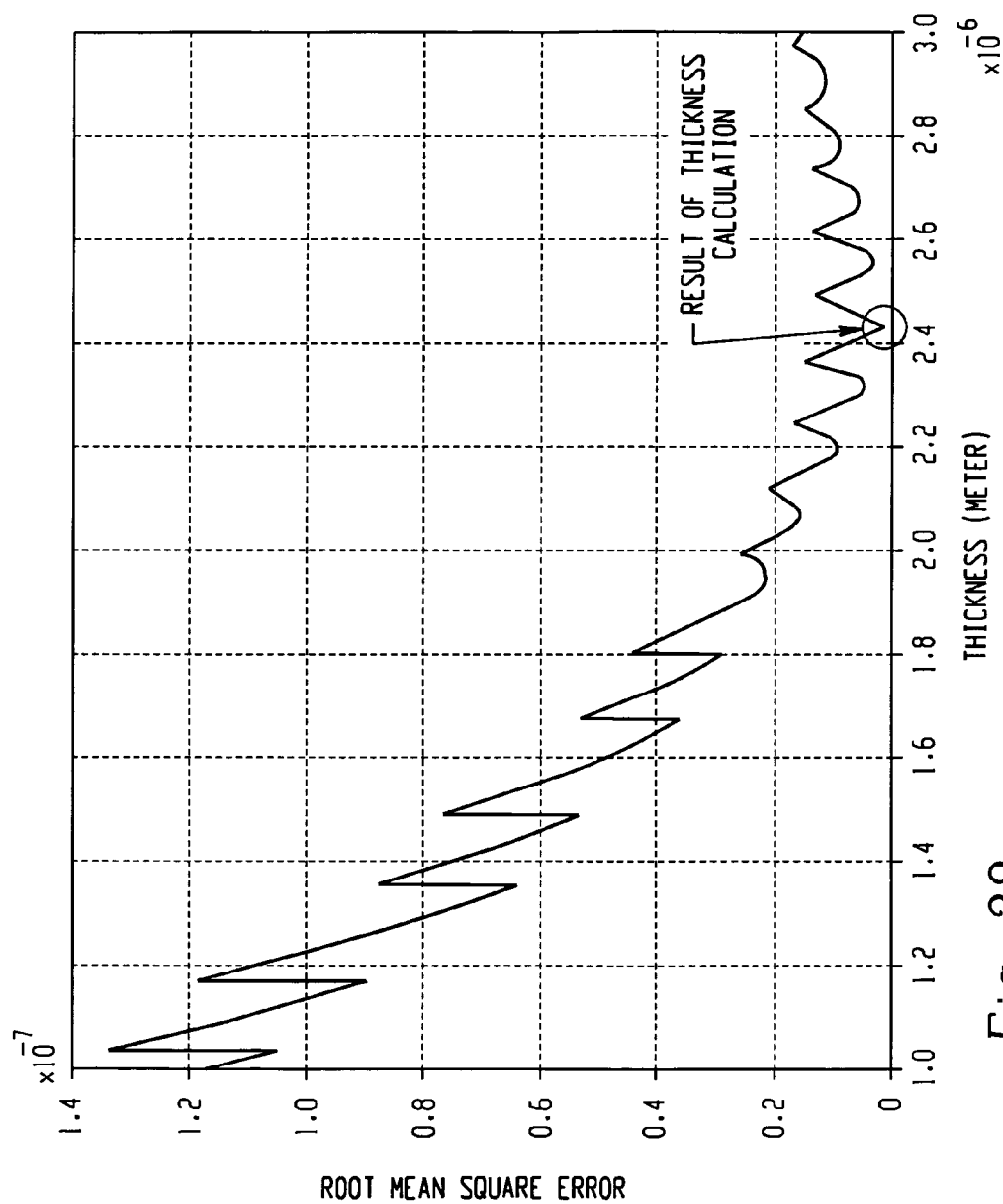
FIG. 28 graphically illustrates a plot of root mean square error as a function of thickness.

The matching program calculated the film thickness to be 2.431 microns whereas the PROMETRIX apparatus gave a film thickness of 2.4198 resulting in a difference of about 0.46 percent. It should be noted that the PROMETRIX apparatus requires 0 degree incident light, which is not feasible for in-situ thickness measurement due to the geometric hardware constraints of the plasma apparatus. Moreover, the algorithms designed for thickness measurement using a 0 degree incident angle would result in significant measurement errors if used at angle other than 0 degrees. The simulated interference pattern at 2.431 microns is illustrated in FIG. 27 and the quality of fit is illustrated in FIG. 28, which graphically illustrates root mean square error as a function of thickness. From this data, it is clear that the matching program closely approximates the accuracy of the off-line measurements and is comparable to measurement of the entire spectrum (matching program utilizes only the peak and valley locations of the spectrum).

Alternatively, as previously indicated, film thickness and related measurements at shallow angles can be determined by a calculating method. As noted with regard to Equation (3), film thickness can generally be measured at an incident angle of 0 degrees. However, at angles other than 0 degrees, the use of Equation (3) is not accurate. For example, at shallow angles, the interference peaks create additional harmonics resulting in a double frequency component. Thus, in order to accurately apply Equation (3), it has been discovered that by selecting every other peak (or valley) location to create pairs (instead of adjacent peaks or valleys used in the matching method), accurate film thickness can be obtained using Equation (3). If the refractive index of a thin film is not constant over wavelength, the equation can be modified as shown in Equation (22).

$$d = \frac{1}{2} \cdot \frac{1}{\frac{\sqrt{n_2(\lambda_2))^2 - n_1^2 \sin^2 \phi_1}}{\lambda_2} - \frac{\sqrt{n_2(\lambda_1))^2 - n_1^2 \sin^2 \phi_1}}{\lambda_1}} \tag{22}$$

Applying Equation (22) to the spectrum shown in FIG. 25 and picking two valleys at 620.5 and 685.0 (Table 1), a film thickness of about 2.4567 microns is obtained. Offline measurement using the PROMETRIX apparatus gave a film thickness of 2.4198, a difference of about 1.525 percent. As expected, the calculating method is less accurate because less data points are employed relative to the matching method. However, because less data is used, the calculation method produces faster results, which may be advantageous for some applications.

In summary, the process generally includes recording spectra in a wavelength domain, one at a time, with the spectrometer. The background spectrum is first subtracted from each recorded spectrum and is then converted from the wavelength domain to an inverse wavelength domain. Fast Fourier Transform (FFT) on the inverse wavelength domains is then performed to produce an FFT domain, which is then filtered. Filtering preferably includes finding the location of the maximum peak. If the incident angle of the measurement system is significantly greater than the Brewster's angle, then the second maximum peak is identified and located. The second peak should be located at about one half or double the frequency of the maximum peak. The minimum valley is located on the right side of the higher (in frequency content space) maximum peak. If the incident angle is significantly smaller than the Brewster's angle, the minimum valley is located on the right side of the peak. All frequency counts between the minimum valley and DC content are kept whereas all frequencies outside these two contents are set to zero. Once filtering is complete, Inverse Fast Fourier Transform (IFFT) is performed. The filtered signal is then converted back to the wavelength domain. Optionally, the filtered spectrum is interpolated to make the samples equally spaced. The thickness of the photoresist is then measured using the matching method or the calculation method depending on the desired application.

The disclosure is explained in more detail with reference to the following non-limiting Examples, which are only illustrative, but not limitative.

EXAMPLES

Example 1

In this example, in situ absolute photoresist thickness was measured for an ashing process using the downstream microwave plasma apparatus generally shown in FIGS. 1-9. The initial thickness and the thicknesses through the expansion, shrinkage, and ashing phases that occur during the ashing process were measured. To verify the accuracy, several wafers were first exposed to the ashing plasma for defined periods of time and measured using offline techniques.

Figure 29:
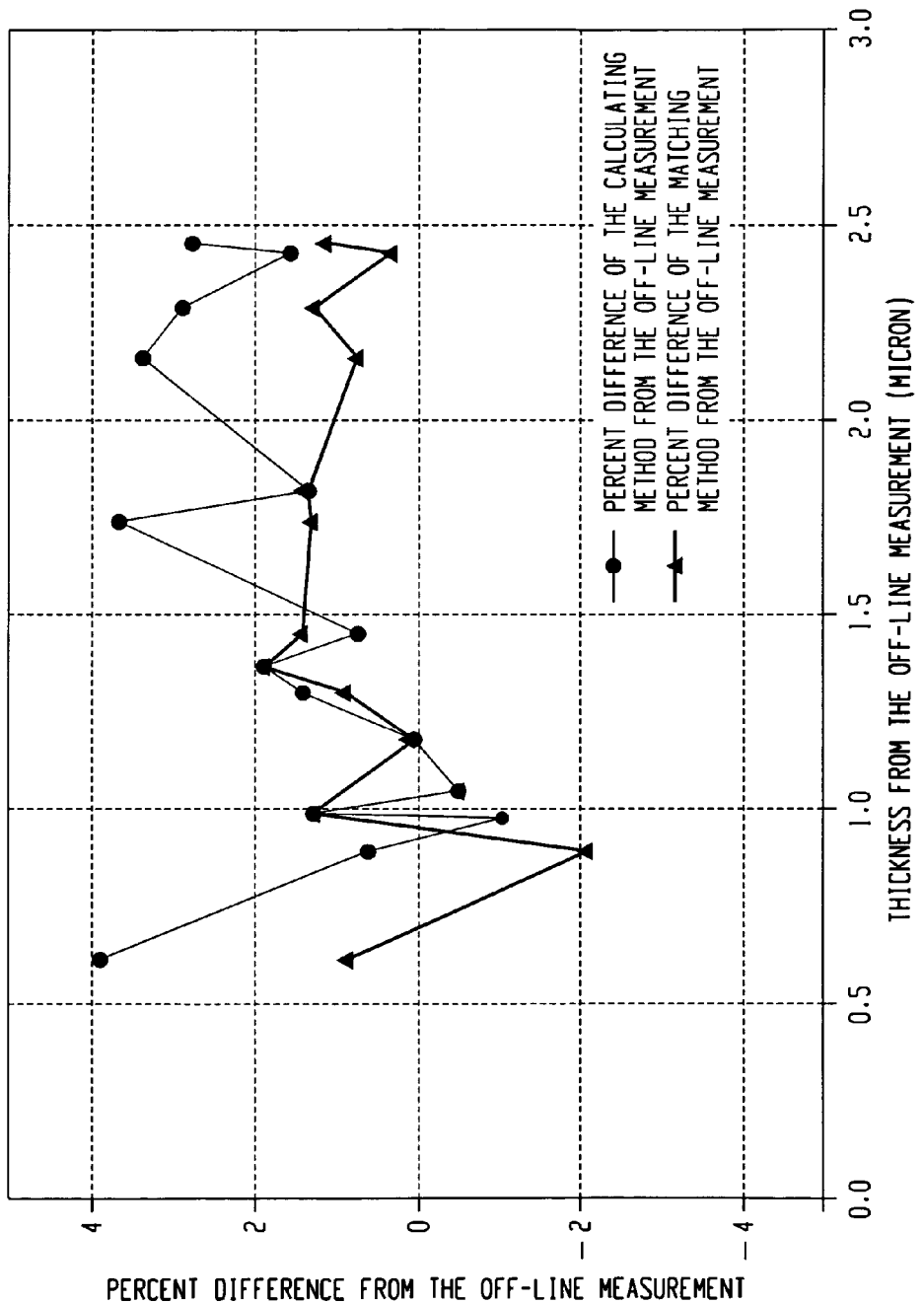
FIG. 29 graphically illustrates percent difference of photoresist thickness calculated from the calculating method and the matching method relative to an off-line thickness measurement.

FIG. 29 graphically illustrates the percent difference for the calculating and matching methods for thickness measurement as compared to the off-line measurement process as a function of thickness as determined by the off-line measurement. From FIG. 29, it is clear that the data produced from the in situ techniques closely correlate with the data produced by the off-line measurement techniques. Moreover, as expected, the matching method for film thickness calculation had greater accuracy (i.e., better agreement to the off-line measurements) than the calculating method. The matching method exhibited a measurement accuracy within 2.1 percent of the offline measurement, whereas the calculating method exhibited an accuracy within 4 percent. The percent differences translate to an absolute thickness difference of 0.03 and 0.08 microns, respectively.

To demonstrate the in-situ measurement process without interruption, wafers were coated with AZP4210 photoresist at an initial thickness of about 1.7 microns and processed using the following ashing recipe as shown in Table 2.

Combining the calculating or matching method with a single wavelength method can be used to track thicknesses below 0.65 microns. The single wavelength method gives the rate of thickness change using Equation (22), which, when coupled with the calculating or matching method (which defines initial thickness), can be used to extend thickness measurements down to about 0 microns. The single wavelength method is described in U.S. Pat. No. 6,585,908, which is incorporated herein by reference in its entirety.

$$\Delta d = \frac{\lambda}{2\sqrt{n_2^2 - n_1^2 \sin^2 \phi_1}} \quad (23)$$

Figure 31:
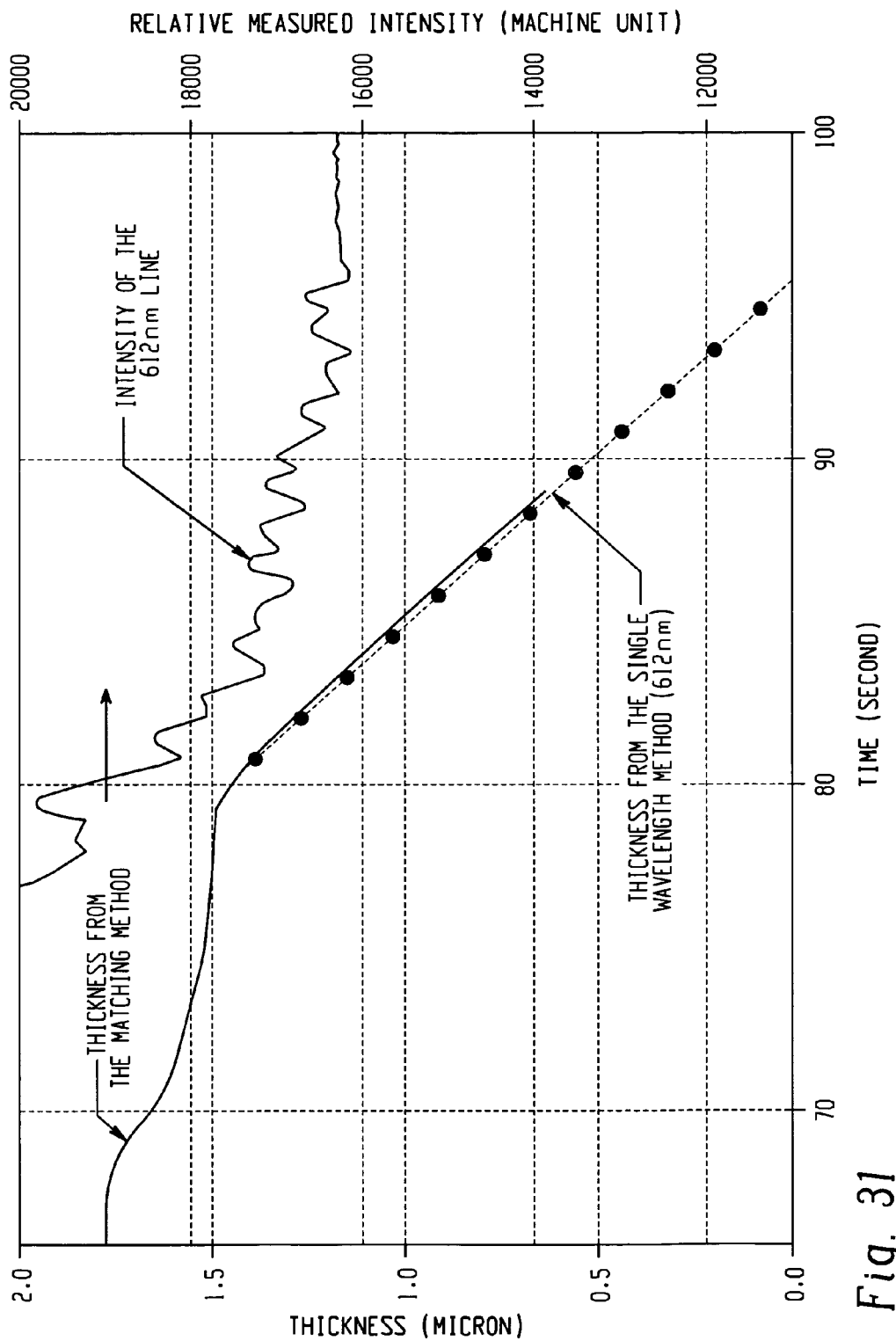
FIG. 31 graphically illustrates photoresist thickness from a single wavelength method using the 612 nm line and the matching method; and intensity of a 612 nm line using the y-axis on the right.

In this example, the single wavelength selected is 612 nm, for which the thickness change for one interference period is 0.2343 microns. FIG. 31 graphically illustrates thickness as a function of time using the combination of the matching method and the single wavelength method. The intensity of the 612 nm line is also provided for reference. Although in this particular example the single wavelength method at 612 nm provided an intensity spectrum that provided sufficient period resolution to determine the ash rate, the single wavelength method is generally prone to noise, making it difficult to track peaks and valleys. In some cases, the amount of noise will prevent the single wavelength method from being combined with the matching method or calculating method to extend the thickness measurement to zero. However, as shown in FIG. 31, the ashing rate is substantially linear as a function of time. Thus, extrapolation using linear regression of the measurement data provided by the matching or calculating method can be used to extend the thickness measurement to zero.

Figure 32:
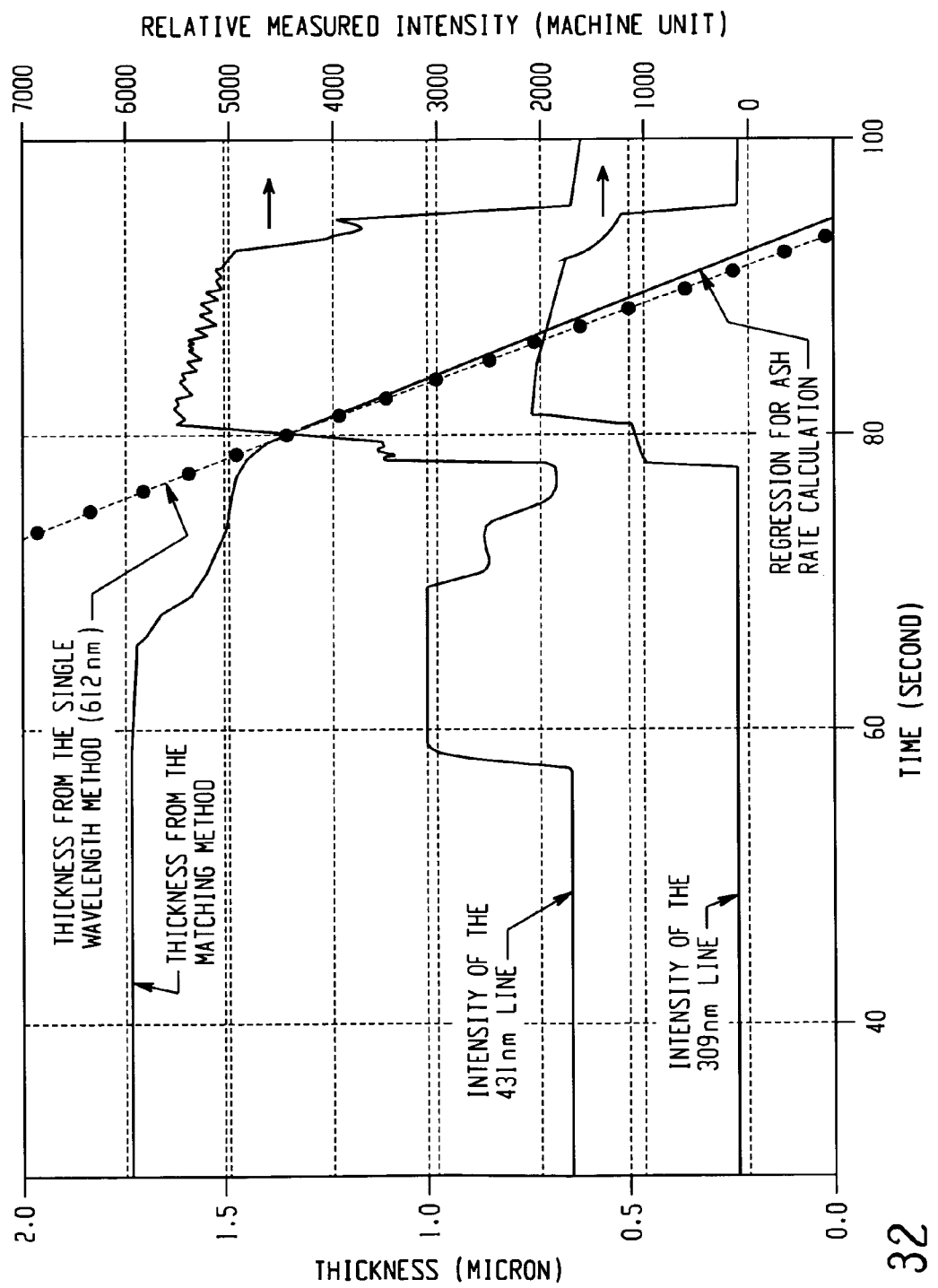
FIG. 32 graphically illustrates photoresist thickness for a single wavelength method using the 612 nm line and the matching method using linear regression to extend the data to the zero thickness baseline; and intensities of the 309 nm and 431 nm lines using the y-axis on the right.

FIG. 32 graphically illustrates in-situ time history of photoresist thickness using the single wavelength method combination and using the matching method with extrapolation. The relative measured intensities of the 309 nm and 431 nm single wavelength lines are plotted as a function of time to provide an indication of endpoint. The 309 nm and the 431 nm lines drop to their baselines at 96 seconds indicating that the photoresist has been completely removed at 96 seconds. The linear regression of the matching method to extend the data to zero thickness yields slightly different photoresist thickness (about 0.0068 microns) relative to the single wavelength thickness and predicts the zero thickness at 96.3 seconds, which is more accurate than the single wavelength method,

TABLE 2

| Step | Time (seconds) | Pressure (torr) | Temperature (° C.) | Microwave Power (watts) | Oxygen Gas Flow (sccm) | Forming Gas Flow (sccm) |
| --- | --- | --- | --- | --- | --- | --- |
| 1 | MIN | 1.5 | 270 | 0 | 9200 | 800 |
| 2 | 25 | 1.5 | 270 | 3800 | 9200 | 800 |

Figure 30:
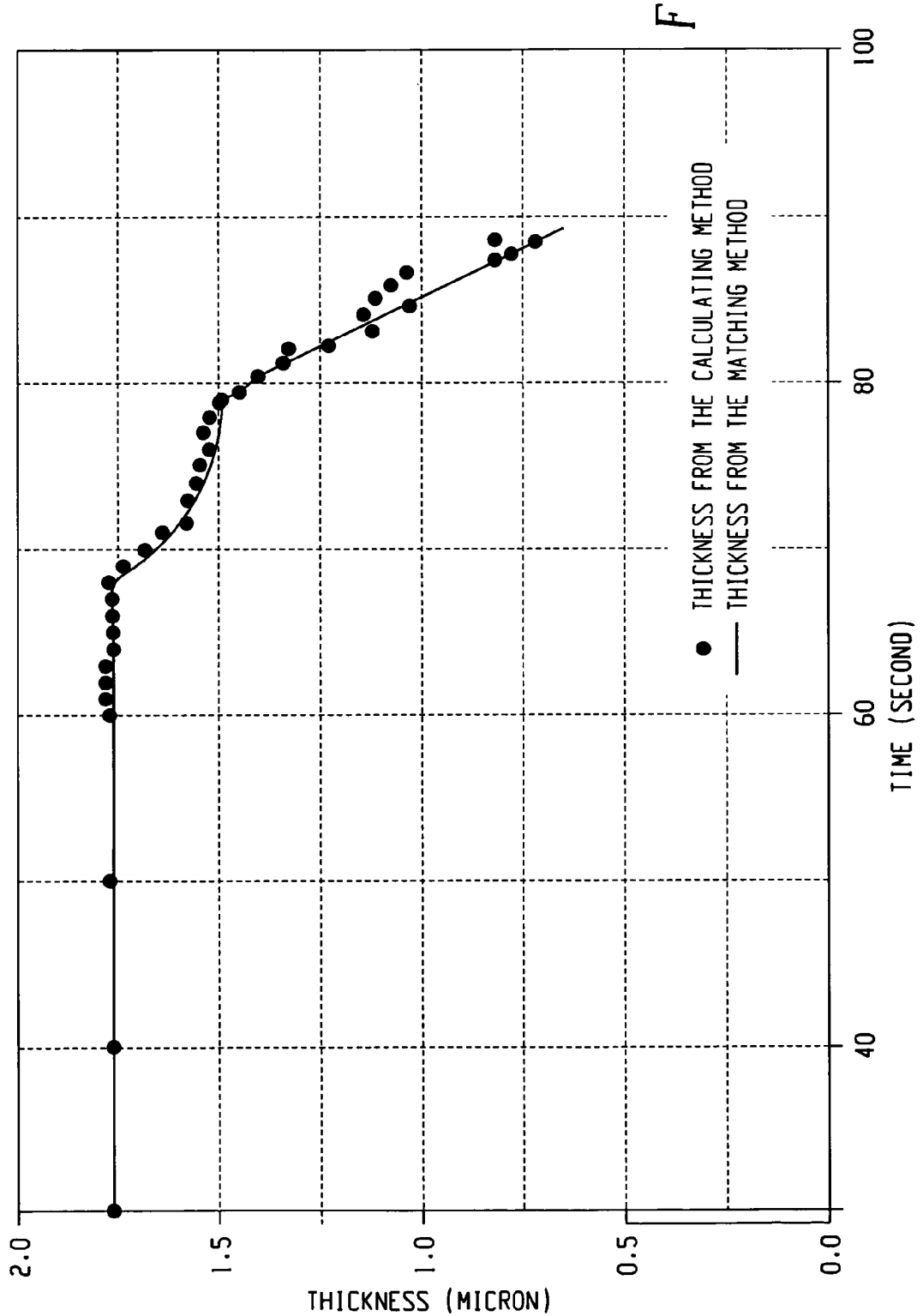
FIG. 30 graphically illustrates photoresist thickness as a function of time using the matching method and the calculating method for determining thickness.

In Table 2, the term "MIN" stands for minimum time to reach temperature, and the term "sccm" stands for standard cubic centimeter per minute. The in-situ measurement process of the time history of the photoresist thickness for the wafer processed using this recipe is illustrated in FIG. 30. As is shown, thickness determination using either measurement method, i.e., matching or calculating, can be used to accurately track initial thickness to about 0.65 microns.

which predicted zero thickness at 95.55 seconds. This greater inaccuracy of the single wavelength method is indicative of the amount of noise inherent to the method.

FIG. 32 also provides data with regards to overashing. As shown in Table 2, the wafer was exposed to plasma for 25 seconds. However, as indicated by the 309 and 431 nm lines, plasma was initiated at 78.8 seconds and was removed at 96 seconds, a time of about 17.2 seconds for complete removal of the photoresist. Thus, the wafer was exposed to plasma for 7.8 seconds in excess of what was needed to completely remove the photoresist. This is the overash time.

Example 2

Figure 33:
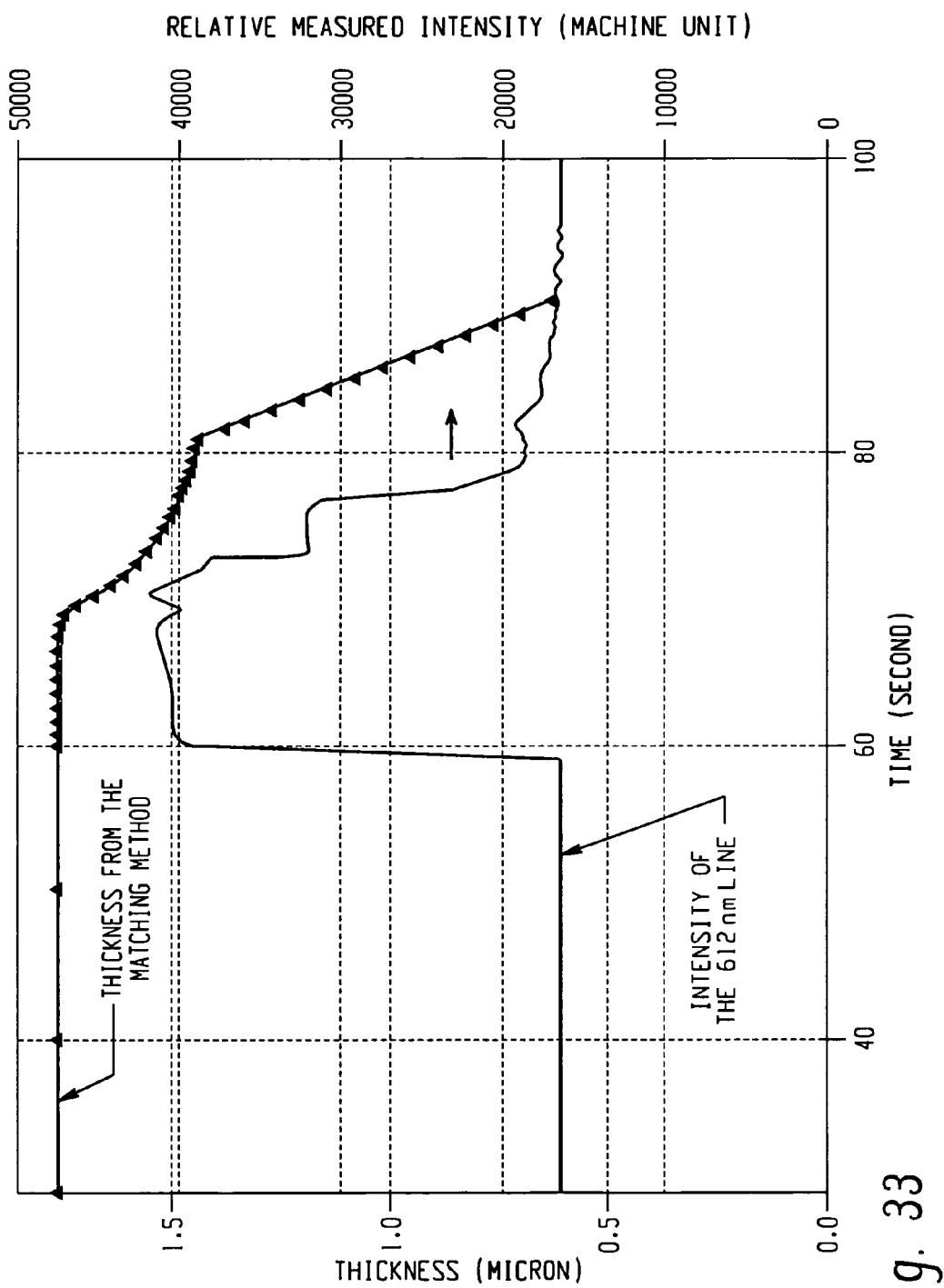
FIG. 33 graphically illustrates photoresist thickness using the matching method; and intensity of the 612 nm line.
Figure 34:
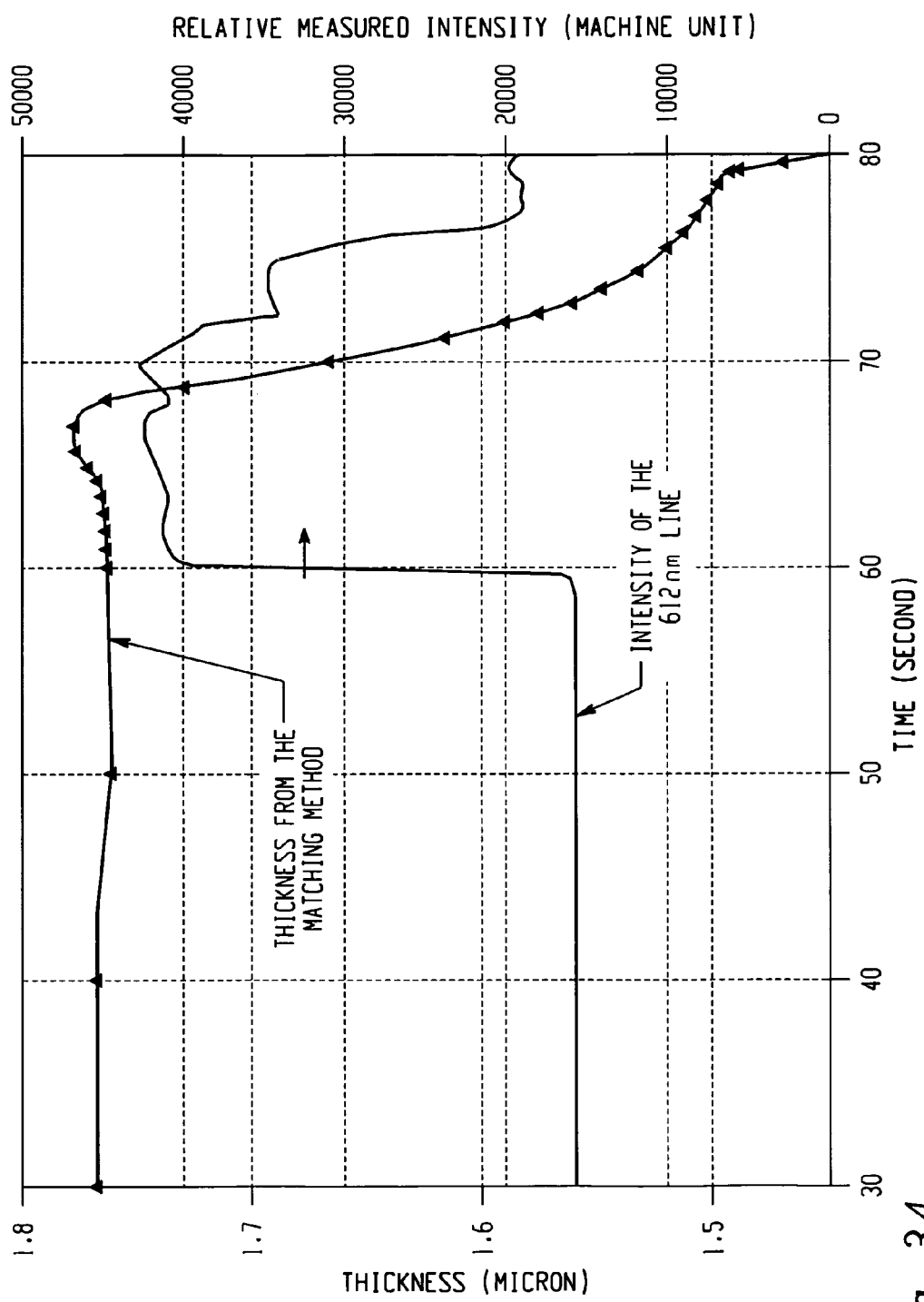
FIG. 34 graphically illustrates photoresist thickness using the matching method illustrating the expansion and shrinkage phases that occur to a photoresist during an ashing process; and intensity of the 612 nm line.

In this example, expansion and contraction of the photoresist is observed upon heating of the wafer. FIG. 33 graphically illustrates in-situ time history of photoresist thickness as a function of time using the matching method. Also included is the intensity of the 612 nm for the process recipe shown in Table 2. As shown, the heater lamps are turned on at about 59.2 seconds, causing an increase in wafer temperature. When the temperature reaches the set point, which in this example is 270° C., the temperature is maintained by decreasing power to the lamps. Decreasing the power results in a decrease in the intensity of the 612 nm line. Since the plasma is turned on at about 78.8 seconds, the MIN step in the recipe takes about 19.6 seconds, i.e. from about 59.2 seconds to about 78.8 seconds. During the MIN step, the photoresist is observed to initially expand and then shrink. This can be more clearly shown in FIG. 34, which illustrates an enlarged section of the spectrum shown in FIG. 33.

Figure 35:
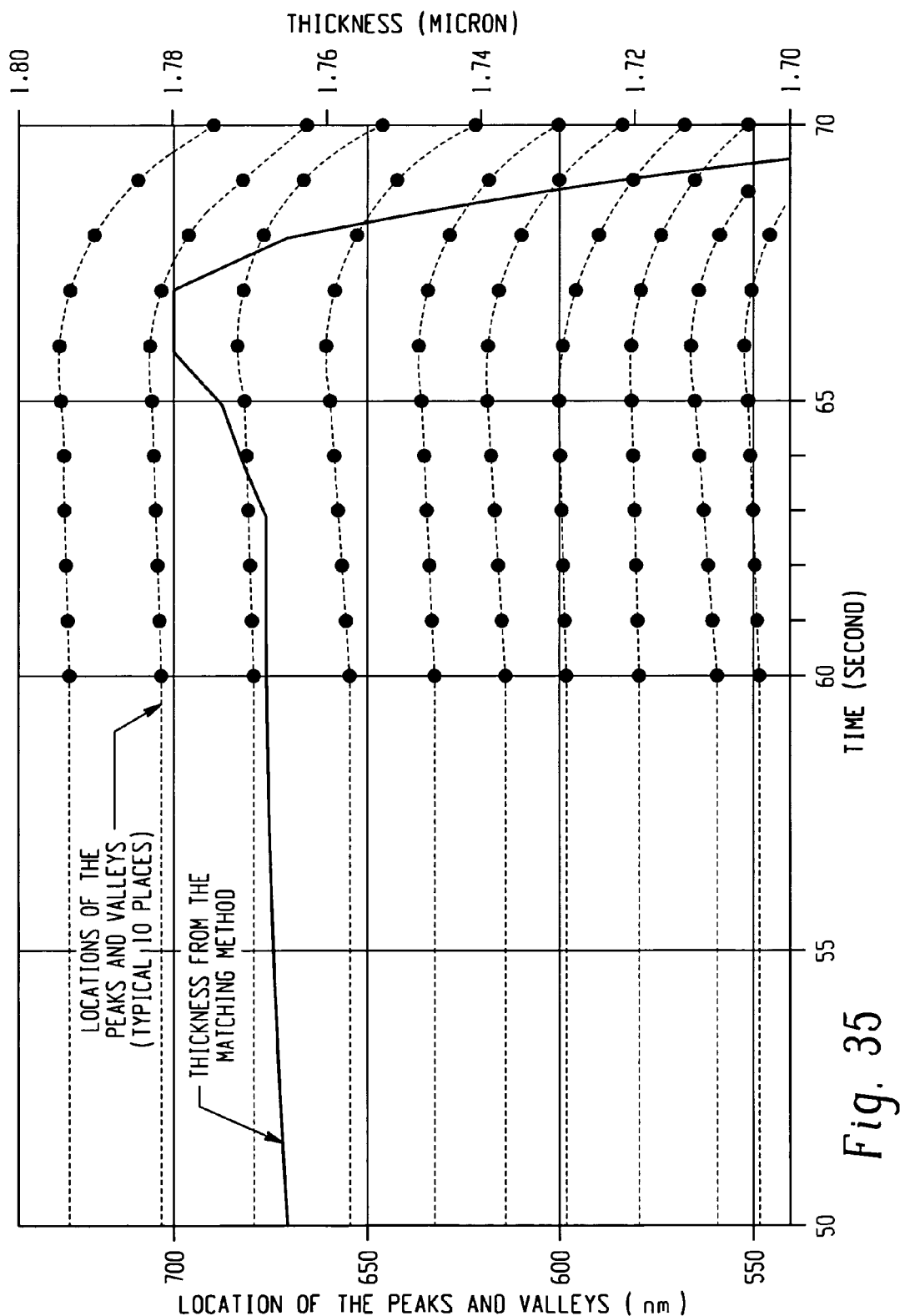
FIG. 35 graphically illustrates photoresist thickness using the matching method; and location of the peaks and valleys as a function of time to illustrate the expansion phase.

The initial expansion cannot be observed using off-line measurement techniques since removal of the wafer is required, which will result in lowering the wafer temperature and causing the photoresist to cool and to return to about its initial thickness. FIG. 35 graphically illustrates the location of the peaks and valleys as a function of time and thickness as a function of time using the matching method. The spectrum moves to higher wavelengths, which implies that the thickness is increasing, i.e., expansion.

Example 3

In this example, the temperature dependence of shrinkage and ash rate is demonstrated. Wafers having photoresist coated thereon were ashed at different temperatures from about 120° C. to about 340° C. at 20-degree increments. The ashing process recipe is presented in Table 3. Table 4 illustrates the conditions for the various wafers. The terms "TT" stand for plasma on-time and "X" stands for temperature.

Figure 36:
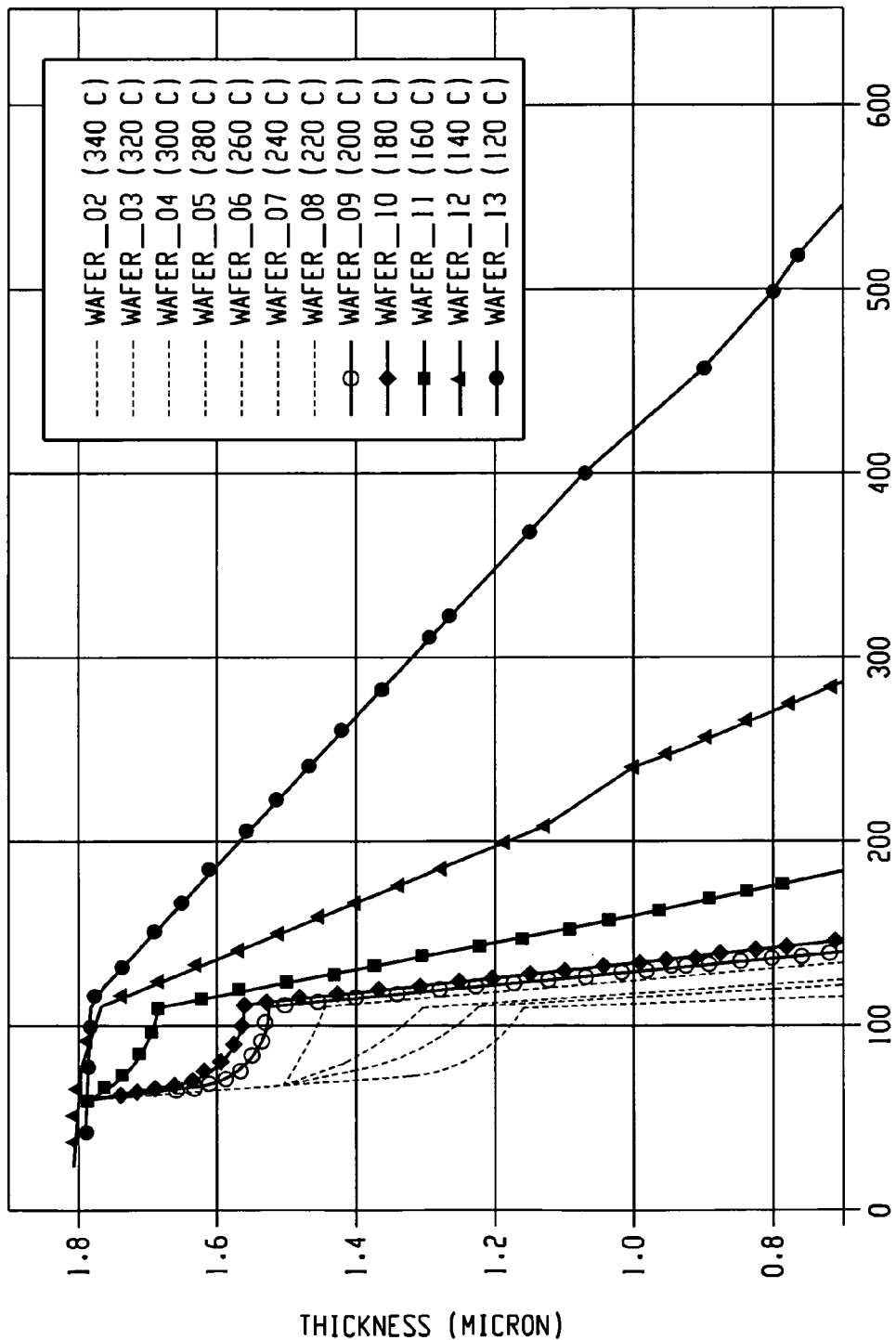
FIG. 36 graphically illustrates photoresist thickness using the matching method as a function of time for various substrate temperatures.
Figure 37:
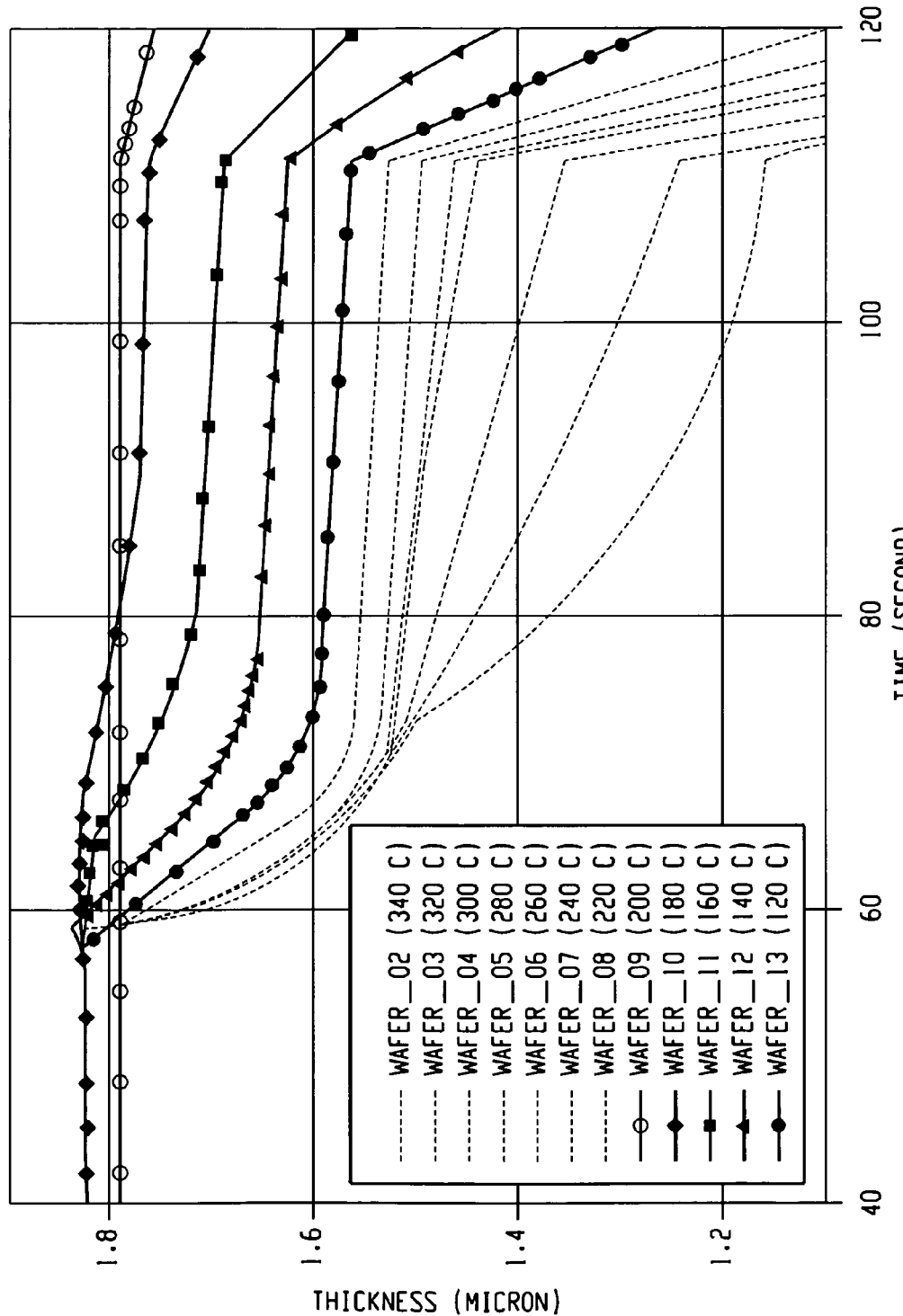
FIG. 37 graphically illustrates photoresist thickness using the matching method as a function of time for various substrate temperatures.

FIGS. 36 and 37 graphically illustrate thickness as a function of time for the various wafers. As is clearly shown, temperature clearly affected the ashing rate. Moreover, expansion and shrinkage was observed as is shown in FIG. 37. From these Figures, it was observed that the higher temperature resulted in greater shrinkage. The ashing rates are summarized in Table 5.

TABLE 5

| Temperature (° C.) | Ash Rate (microns/minute) |
| --- | --- |
| 120 | 0.148 |
| 140 | 0.347 |
| 160 | 0.786 |
| 180 | 1.536 |
| 200 | 2.472 |
| 220 | 3.486 |
| 240 | 4.452 |
| 260 | 5.196 |
| 280 | 5.928 |
| 300 | 6.156 |
| 320 | 6.542 |
| 340 | 6.710 |

From this data, endpoint detection can be readily calculated using the photoresist thickness at a given time and the ash rate.

Example 4

In this example, the in-situ measurement method was performed on a patterned wafer having a line-thickness/space pattern of about 1.2 microns/2.3 microns, respectively. The following ashing recipe as shown in Table 6 was employed.

TABLE 3

| Step | Time (seconds) | Pressure (torr) | Temperature (° C.) | Microwave Power (watts) | Oxygen Gas Flow (sccm) | Forming Gas Flow (sccm) |
| --- | --- | --- | --- | --- | --- | --- |
| 1 | MIN | 1.5 | X | 0 | 9200 | 800 |
| 2 | 40 | 1.5 | X | 0 | 9200 | 800 |
| 3 | TT | 1.5 | X | 3800 | 9200 | 800 |

TABLE 4

| | Wafer No. | | | | | | | | | | | |
| --- | --- | --- | --- | --- | --- | --- | --- | --- | --- | --- | --- | --- |
| | 2 | 3 | 4 | 5 | 6 | 7 | 8 | 9 | 10 | 11 | 12 | 13 |
| TT | 20 | 30 | 30 | 30 | 30 | 30 | 30 | 60 | 90 | 150 | 300 | 600 |
| X | 340 | 320 | 300 | 280 | 260 | 240 | 220 | 200 | 180 | 160 | 140 | 120 |

TABLE 6

| Step | Time (seconds) | Pressure (torr) | Temperature (° C.) | Microwave Power (watts) | Oxygen Gas Flow (sccm) | Forming Gas Flow (sccm) |
|---|---|---|---|---|---|---|
| 1 | 5 | 1.5 | — | 0 | 2510 | 240 |
| 2 | MIN | 1.5 | 270 | 0 | 2510 | 240 |
| 3 | 50 | 1.5 | 270 | 0 | 2510 | 240 |
| 4 | 25 | 1.5 | 270 | 1500 | 2510 | 240 |

Figure 38:
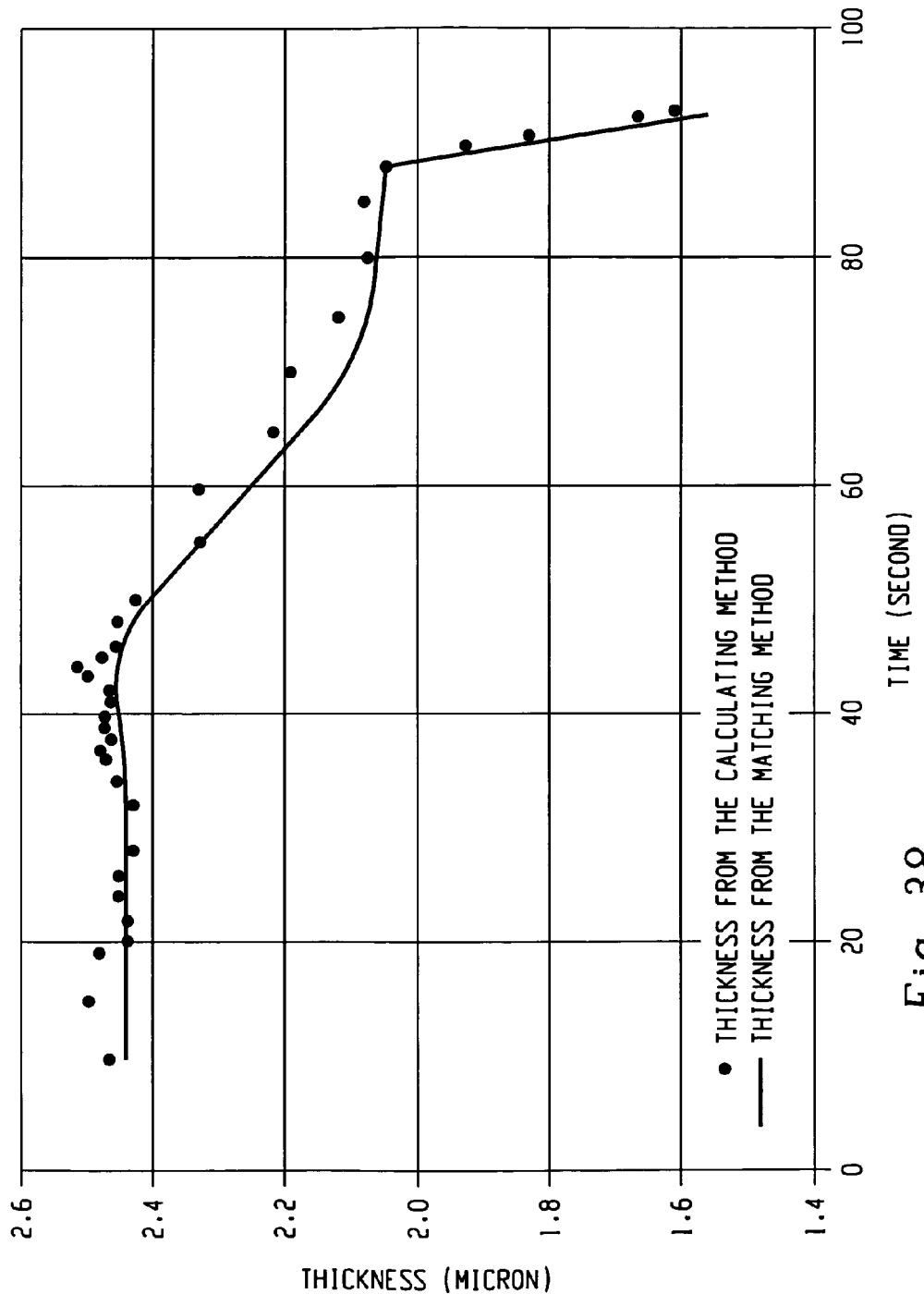
FIG. 38 graphically illustrates photoresist thickness as a function of time using the calculating method and the matching method for a patterned substrate.
Figure 39:
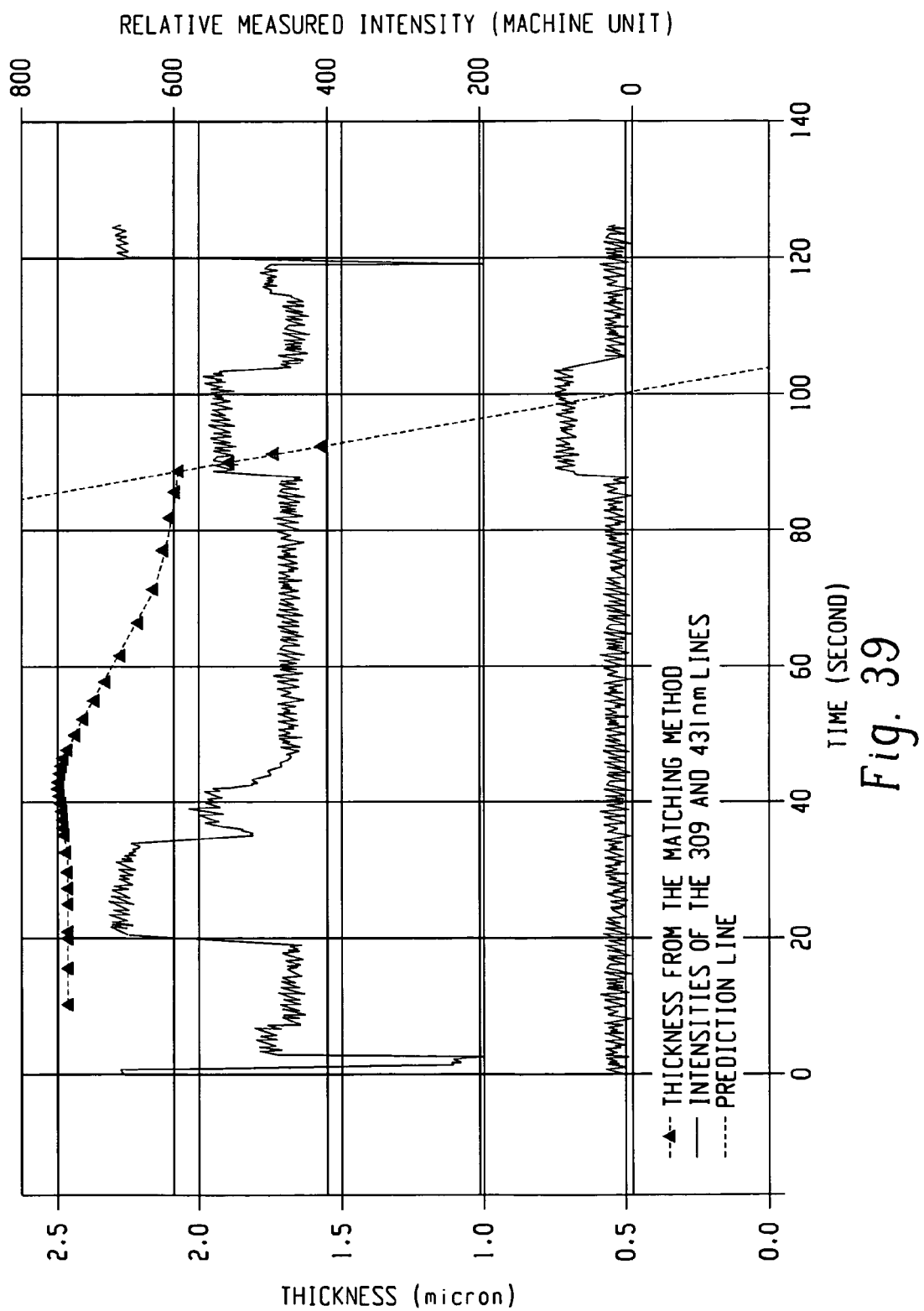
FIG. 39 graphically illustrates photoresist thickness as a function of time at a substrate temperature of 270° C. using the matching method with linear endpoint prediction; and intensities of the 309 nm and 431 nm line using the y-axis of the right.

FIG. 38 graphically illustrates in-situ time history of photoresist thickness using the calculating method and the matching method. As shown, the in-situ thickness can be tracked only down to about 1.55 microns, which is believed to be the result of a low signal to noise ratio as a result of less photoresist remaining on the patterned wafer compared to a blanket coated wafer. It is noted that the single wavelength method is not suitable for application to extend the photoresist thickness tracking below 1.55 to the zero baseline. The resolution of the peaks and valleys of the 612 nm line or for any other line is not suitable for determining an interference period. However, linear extrapolation of the data can be used to get an accurate zero thickness point close to where the 309 nm and 431 nm lines drop their intensities to the baseline. FIG. 39 graphically illustrates the predicted zero line based on the extrapolation below about 1.55 microns. FIG. 39 also provides the intensities of the 309 nm and 431 nm lines. The zero thickness line based on the extrapolation intersects at about 104.9 seconds. The endpoint as indicated by the 309 nm and 431 nm lines is at 105.0 seconds. Based on the slope of the prediction line, ashing rate is determined to be 7.59 microns per minute. Thus, the 0.1-second difference translates to a photoresist thickness difference of only 0.01265 microns from the in-situ method with extrapolation using linear regression and the endpoints as illustrated by the chemiluminescence interference patterns at 309 nm and 431 nm lines.

Advantageously, the in-situ thickness related measurement apparatus and process can be used to accurately measure real time thickness, ash rate, and endpoint during an ashing process. The process can be used with lamp based heater systems, which normally would introduce a time varying optical noise into the measurement system, using optical instruments. The process and apparatus provides high incident angle measurement and is thus suitable for use with existing process chambers. Moreover, with regard to photoresist applications, the expansion and shrinkage during an ashing process can be closely and accurately monitored, which cannot be done in other measurement techniques and is a source of error for those other measurement techniques. The in-situ measurement apparatus and process can be used to prevent under- and over-ashing, which can deleteriously affect device fabrication.

While the disclosure has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A wafer processing system, comprising:
a wafer processing chamber including a support for positioning at least one wafer within an interior region of the chamber, wherein the support comprises at least one temperature measuring device in thermal contact with the at least one wafer;
a source that routes a wafer treatment material into the processing chamber for removing a coating from an exposed surface of the at least one wafer;
an optical measuring apparatus including receiving optics in optical communication with the chamber, wherein the receiving optics are focused on or about a surface of the coating at a shallow angle and configured to detect an interference pattern associated with a wavelength spectrum, wherein the shallow angle is close to 90 degrees relative to the normal plane of the wafer such that radiation contributing to the interference pattern captured by the receiving optics has a localized origin;
a single external broadband illumination source disposed above the wafer and adapted to project broadband radiation into the chamber, wherein the single external broadband illumination source is the only illumination source; and
computing means in communication with the receiving optics for computing the film thickness, or the film removal rate, or the endpoint from the interference pattern or combinations thereof.

2. The wafer processing system of claim 1, wherein the broadband illumination system is a tungsten halogen lamp.

3. The wafer processing system of claim 1, further comprising a heating lamp array positioned below the at least one wafer.

4. The wafer processing system of claim 1, wherein the broadband illumination source is disposed in an opposing sidewall of the chamber relative to a location of the receiving optics.

5. The wafer processing system of claim 1, wherein the receiving optics comprise an array of fiber optic fibers having one end in optical communication with a diffraction grating of a spectrometer.

6. The wafer processing system of claim 1, further comprising a window intermediate the receiving optics and an interior region of the chamber.

7. The wafer processing system of claim 1, wherein the coating is a photoresist material.

8. The wafer processing system of claim 1, wherein the wafer treatment material comprises plasma of excited atomic species.

9. The wafer processing system of claim 1, further comprising a lens intermediate the receiving optics and an interior region of the wafer processing chamber.

10. The wafer processing system of claim 9, wherein the lens is a cylindrical lens with an equal radius of curvature at each end of the cylindrical lens.

11. The wafer processing system of claim 1, wherein the receiving optics in optical communication with the chamber is recessed from an interior region of the wafer processing chamber.

12. The wafer processing system of claim 1, wherein the single external broadband illumination source is plasma.

* * * * *